(12) United States Patent
Takeuchi

(10) Patent No.: US 9,595,528 B2
(45) Date of Patent: Mar. 14, 2017

(54) SEMICONDUCTOR DEVICE AND METHOD OF MANUFACTURING THE SAME

(71) Applicant: RENESAS ELECTRONICS CORPORATION, Kanagawa (JP)

(72) Inventor: Masahiko Takeuchi, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/632,986

(22) Filed: Feb. 26, 2015

(65) Prior Publication Data

US 2015/0171092 A1 Jun. 18, 2015

Related U.S. Application Data

(62) Division of application No. 13/367,858, filed on Feb. 7, 2012, now Pat. No. 8,981,422.

(30) Foreign Application Priority Data

Feb. 22, 2011 (JP) ................................. 2011-035968

(51) Int. Cl.
*H01L 29/66* (2006.01)
*H01L 27/11* (2006.01)
(Continued)

(52) U.S. Cl.
CPC .... *H01L 27/1104* (2013.01); *H01L 21/76834* (2013.01); *H01L 21/76895* (2013.01); *H01L 27/0207* (2013.01); *H01L 29/42356* (2013.01)

(58) Field of Classification Search
CPC ......... H01L 21/76834; H01L 29/42356; H01L 27/0207; H01L 27/11807–27/11898;
(Continued)

(56) References Cited

U.S. PATENT DOCUMENTS 5,043,298 A * 8/1991 Yamada ............ H01L 27/10808
257/E27.086
7,633,126 B2 12/2009 Matsui
(Continued)

FOREIGN PATENT DOCUMENTS

CN 101232019 A 7/2008
CN 101740516 A 6/2010
(Continued)

OTHER PUBLICATIONS

Notification of the First Office Action Chinese Patent Application No. 2015073101420220 dated Aug. 5, 2015 with full English translation.
(Continued)

*Primary Examiner* — Cuong B Nguyen
(74) *Attorney, Agent, or Firm* — McDermott Will & Emery LLP

(57) ABSTRACT

To prevent contact plugs formed to sandwich an abutting portion between gate electrodes, from being short-circuited via a void formed inside an insulating film of the abutting portion. Over sidewalls SW facing each other in the abutting portion between gate electrodes G2 and G5, a liner insulating film 6 and an interlayer insulating film 7 are formed. Between the sidewalls SW, the liner insulating film 6 formed on each of the side walls of the sidewalls SW are brought in contact with each other to close a space between the sidewalls SW to prevent a void from being generated inside the interlayer insulating film 7 and the liner insulating film 6.

5 Claims, 23 Drawing Sheets

(51) Int. Cl.
*H01L 21/768* (2006.01)
*H01L 27/02* (2006.01)
*H01L 29/423* (2006.01)

(58) Field of Classification Search
CPC ....... H01L 2027/11805; H01L 27/1024; H01L 27/1104; H01L 29/423; H01L 27/11
See application file for complete search history.

(56) References Cited

U.S. PATENT DOCUMENTS

| | | | |
|---|---|---|---|
| 7,964,917 B2 | 6/2011 | Akamatsu | |
| 7,977,183 B2 | 7/2011 | Koide | |
| 2006/0237851 A1* | 10/2006 | Ko | H01L 23/485 257/774 |
| 2009/0140396 A1 | 6/2009 | Richter et al. | |
| 2011/0248330 A1* | 10/2011 | Yaegashi | H01L 27/115 257/316 |

FOREIGN PATENT DOCUMENTS

| | | |
|---|---|---|
| JP | 2007-67371 A | 3/2007 |
| JP | 2008-182022 A | 8/2008 |
| JP | 2009-252825 | 10/2009 |

OTHER PUBLICATIONS

Notice of Allowance U.S. Appl. No. 13/367,858 dated Nov. 6, 2014.
Notification of Reasons for Refusal Japanese Patent Application No. 2011-035968 dated Sep. 2, 2014 with English translation.
Non-Final Office Action U.S. Appl. No. 13/367,858 dated Aug. 15, 2013.
Non-Final Office Action U.S. Appl. No. 13/367,858 dated Jul. 8, 2013.
Office Action Taiwan Patent Application No. 101105692 dated Oct. 22, 2015 with English translation.

* cited by examiner

FIG. 8
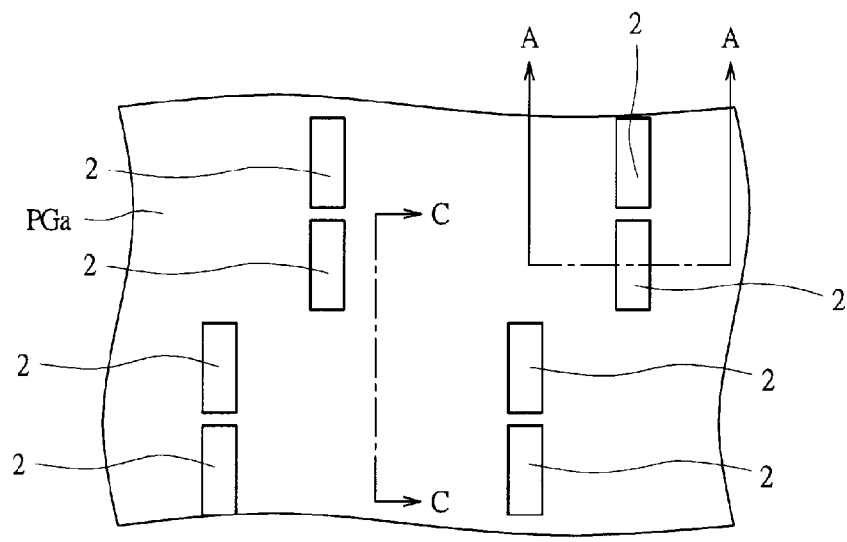
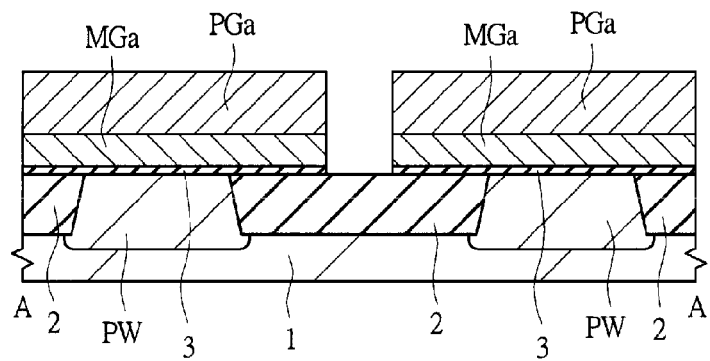
FIG. 9A
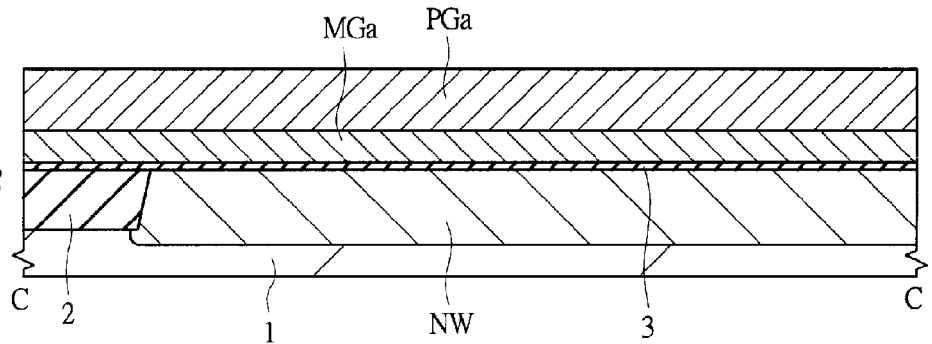
FIG. 9B

SEMICONDUCTOR DEVICE AND METHOD OF MANUFACTURING THE SAME

CROSS-REFERENCE TO RELATED APPLICATION

This application is a Divisional Application of U.S. Ser. No. 13/367,858 filed Feb. 7, 2012, which claims priority to Japanese Patent Application No. 2011-035968 filed on Feb. 22, 2011. The subject matter of each is incorporated herein by reference in entirely.

BACKGROUND

The present invention relates to a semiconductor device and a method of manufacturing the same, and in particular relates to the technique effectively applied to the manufacturing of a semiconductor element with a gate electrode having a small interval in an abutting portion.

BACKGROUND ART

As a semiconductor device is miniaturized, in reducing the design in a direction parallel to an extending direction of a gate constituting an Static Random Access Memory (SRAM) (in a gate abutting direction (gate width direction)), there is a method of patterning the gate electrode constituting the SRAM by two-time exposure and two-time etching. This method is a technique, in which for achieving a reduction in size of the semiconductor device, a mask for separating agate edge is added to process the gate edge. This technique is used for a plurality of Metal Insulator Semiconductor (MIS) type Field Effect Transistors (FETs) intermittently arranged in one direction. Each FET has a gate electrode extending in this direction. In the present application, such a technique is referred to as an "end-cut" to process the abutting portion of gate electrodes by adding a mask for patterning. By using the "end-cut", in arranging a plurality of gate patterns in one row in the extending direction, an interval in the abutting portion of the gate electrodes can be precisely reduced to form the gate electrodes.

Japanese Patent Laid-Open No. 2009-252825 (Patent Document 1) describes a technique to prevent avoid from being generated inside an interlayer insulating film which is formed between narrow gate electrodes and prevent a conductive material arranged sandwiching a region between the gate electrodes, from becoming conducted via a void. Patent Document 1 also describes a reduction in the aspect ratio of apart of a region between adjacent gate electrodes. The techniques described in Patent Document 1 have nothing to do with an abutting portion in which the edges of gate electrodes are adjacent facing each other.

SUMMARY

In a semiconductor device with a gate electrode formed using the "end-cut", between adjacent gate electrodes in the gate length direction of the gate electrode, an interval between the gate electrodes is wider than that between the gate electrodes in the above-mentioned abutting portion, and thus the embeddability of an interlayer insulating film formed between the gate electrodes causes no problem. In contrast, in miniaturized semiconductor devices, such as semiconductor devices with the 32-nm node and ones manufactured later than the devices, the embeddability of an interlayer insulating film between adjacent gate electrodes in the extending direction of the gate electrode (the embeddability in the abutting portion) may cause a problem.

If the "end-cut" is performed in the manufacturing process of the semiconductor devices with the 32-nm node, 28-nm node, or the like, a distance between adjacent gate electrodes in the extending direction of the gate electrode (the distance in the abutting portion) becomes approximately 30 to 50 nm. When an interlayer insulating film is formed over a plurality of gate electrodes having such a short interval, the embeddability degrades because the distance between the gate patterns is short in the abutting portion and a void is likely to be formed inside the interlayer insulating film. Subsequently, if a contact hole is formed in the interlayer insulating film to sandwich the abutting portion having a void formed inside and a contact plug is formed by embedding a conductive member including W (tungsten) or the like into each contact hole, there is a problem in which the void is also filled with the conductive member and two contact plugs are short-circuited via the conductive member inside the void and the yield degrades or the reliability of the semiconductor device degrades.

The present invention has been made in view of the above circumstances. The purpose of the present invention is to improve the yield during manufacturing processes or improve the reliability of semiconductor devices.

In particular, the purpose of the present invention is to prevent contact plugs from being short-circuited via a void between gate electrodes.

The above-mentioned and other purposes and the new feature of the present invention will become clear from the description of the present specification and the accompanying drawings.

The following will explain briefly the outline of a typical embodiment among the embodiments disclosed in the present application.

A semiconductor device according to a preferable embodiment of the present invention includes a plurality of gate electrodes extending in a first direction along a major surface of a semiconductor substrate, the gate electrodes formed over the semiconductor substrate by being aligned in a first direction; a first insulating film formed between the adjacent gate electrodes in the first direction; a second insulating film formed in an upper surface of the semiconductor substrate exposed from the gate electrode, the second insulating film being formed on the lateral side of the gate electrodes, respectively, in a second direction perpendicular to the first direction; and a plurality of contact plugs arranged on both sides of the first insulating film and connected to the semiconductor substrate. The first insulating film and the second insulating film constitute a third insulating film which is formed to cover the semiconductor substrate and the gate electrodes. The lowest position of the upper surface of the first insulating film is higher than that of the upper surface of the second insulating film.

A method of manufacturing a semiconductor device according to a preferable embodiment of the present invention includes the steps of (a) forming a plurality of gate electrodes extending in a first direction along a major surface of a semiconductor substrate, the gate electrodes being aligned in the first direction, over the semiconductor substrate via a gate insulating film; (b) forming a source/drain region on the major surface of the semiconductor substrate on both sides of the gate electrodes, (c) forming a sidewall on aside wall of the gate electrodes; (d) after the step (b) and step (c), sequentially forming a second insulating film and a third insulating film over the semiconductor substrate from the semiconductor substrate side to cover the gate electrodes, the source/drain region, and the sidewall; and (e) on both sides of a region between the adjacent gate electrodes in the first direction, forming a plurality of through-holes penetrating the second insulating film and the third insulating film, and subsequently forming a contact plug connected to the source/drain region inside each of the through-holes. The lowest position of an upper surface of the second insulating film between the adjacent gate electrodes in the first direction is higher than the lowest position of the upper surface of the second insulating film formed in an upper surface of the semiconductor substrate exposed from the gate electrodes and the sidewall in a second direction perpendicular to the first direction.

The following explains briefly the effect acquired by the typical invention among the inventions disclosed in the present application.

The yield during the manufacturing process of semiconductor devices can be improved or the reliability of semiconductor devices can be improved.

It is possible to prevent contact plugs from being short-circuited via a void between gate electrodes.

BRIEF DESCRIPTION OF THE DRAWINGS

FIG. 8 is a two-dimensional layout during a manufacturing process of the semiconductor device following FIG. 7A and FIG. 7B.

FIG. 9A is a cross-sectional view during a manufacturing process of the semiconductor device following FIG. 7A.

FIG. 9B is a cross-sectional view during a manufacturing process of the semiconductor device following FIG. 7B.

DETAILED DESCRIPTION

Figure 1:
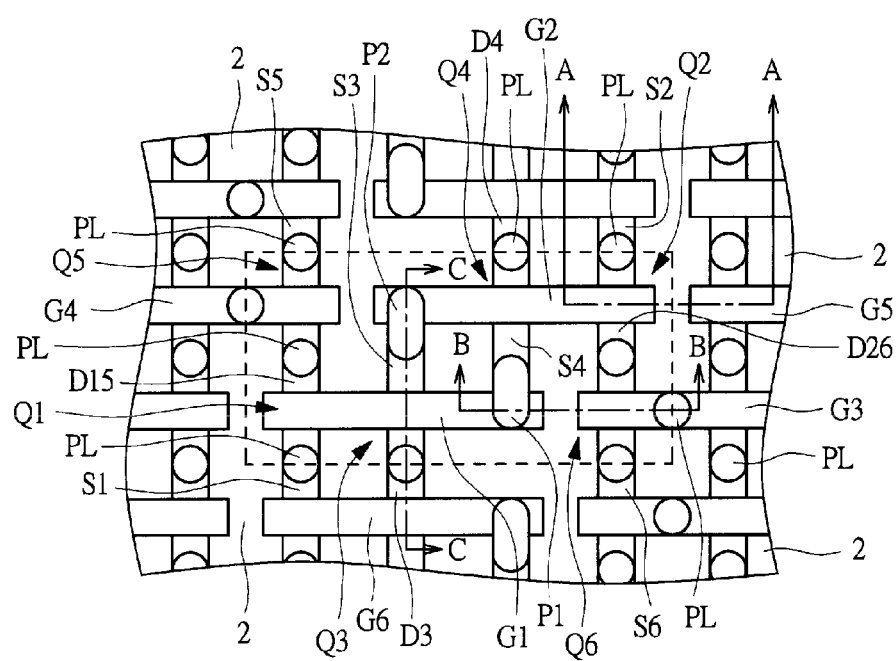
FIG. 1 is a layout showing a semiconductor device of Embodiment 1 in accordance with the present invention.

The embodiments of the present invention will be described in detail with reference to the accompanying drawings. In addition, throughout the accompanying drawings for illustrating the embodiments, the same member having the same function is given the same reference numeral, and the repeated explanation is omitted. In the following embodiments, the explanation of the same or similar portion is not repeated unless otherwise particularly necessary.

Embodiment 1

Figure 2:
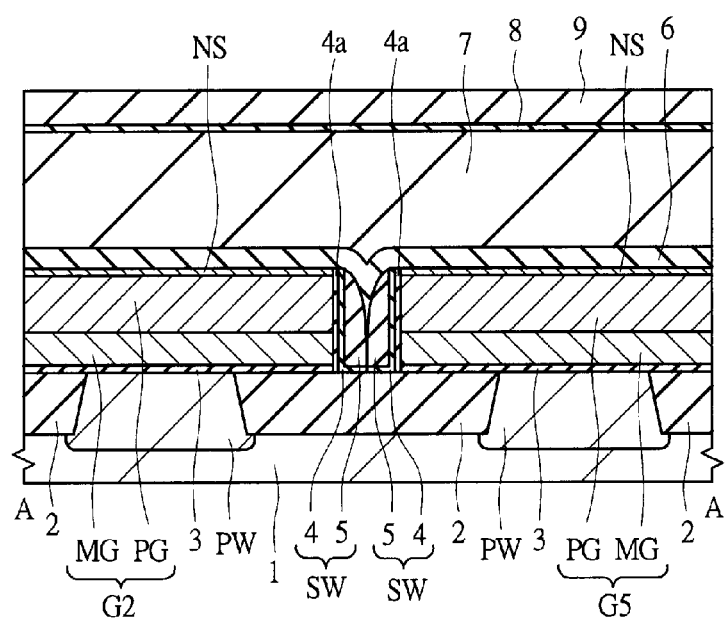
FIG. 2 is a cross-sectional view in an A-A line in FIG. 1.
Figure 3:
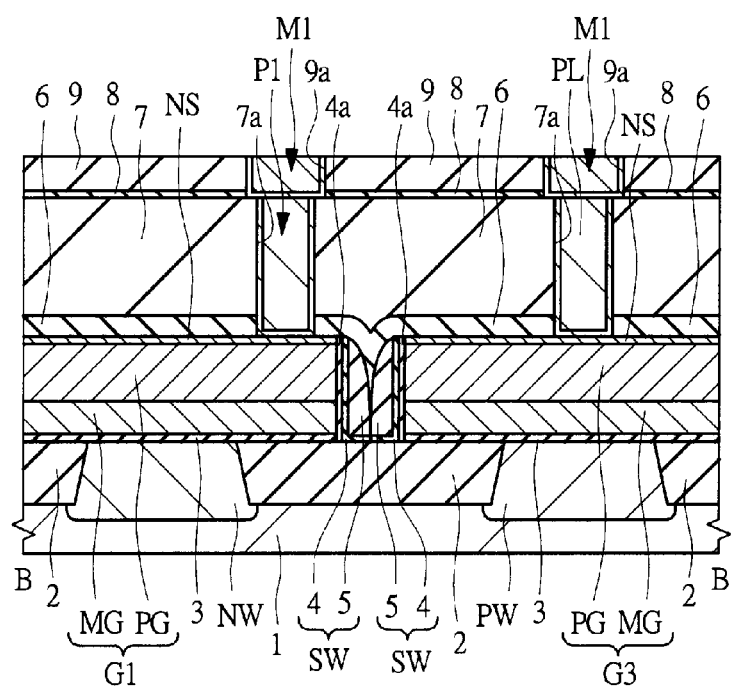
FIG. 3 is a cross-sectional view in a B-B line in FIG. 1.
Figure 4:
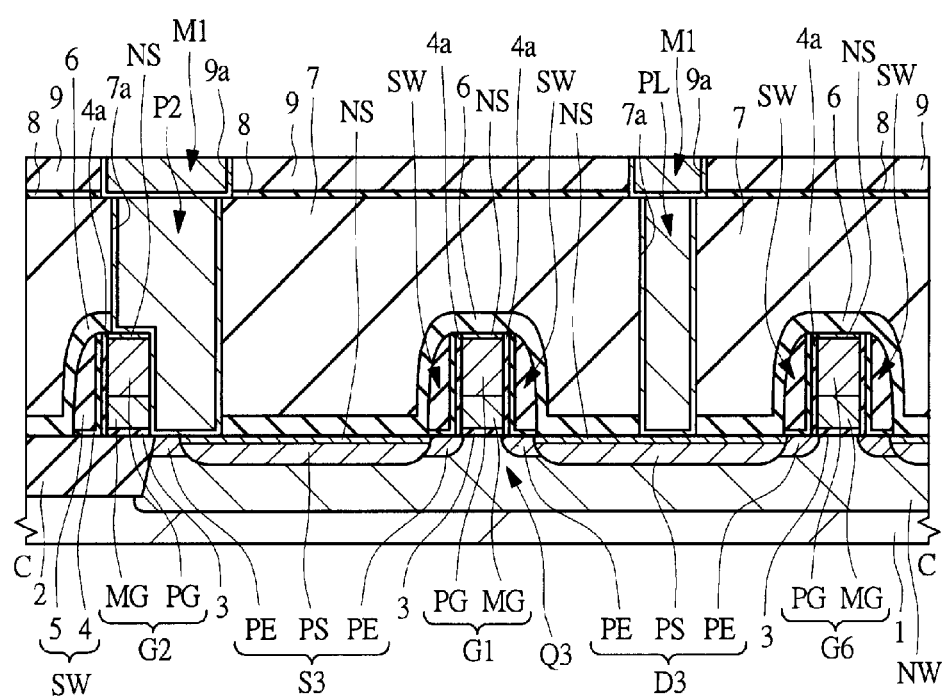
FIG. 4 is a cross-sectional view in a C-C line in FIG. 1.
Figure 5A:
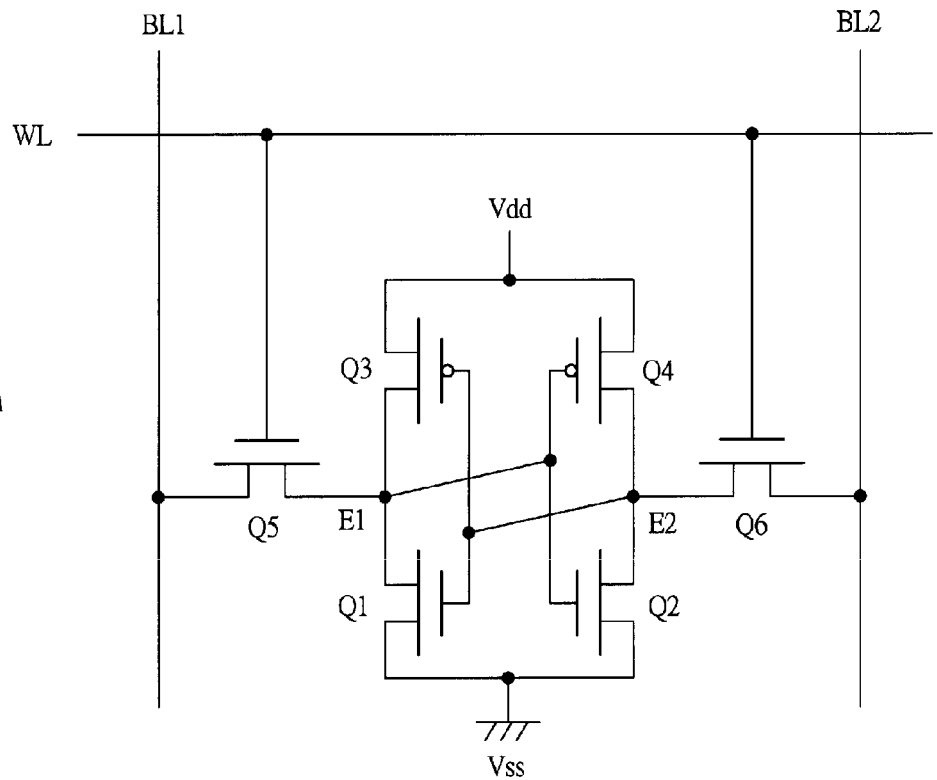
FIG. 5A is an equivalent circuit diagram of an SRAM of Embodiment 1.

A semiconductor device of Embodiment 1 is described with reference to FIG. 1 to FIG. 5A. FIG. 1 is a layout of a semiconductor device with an SRAM including a plurality of MISFETs formed over a semiconductor substrate. FIG. 2 is a cross-sectional view including a gate electrode constituting the MISFET formed over the semiconductor substrate 1, showing the cross section of an abutting portion (a gate edge portion facing each other) of the gate electrodes in an A-A line in FIG. 1. FIG. 3 is a cross-sectional view in a B-B line in FIG. 1, showing the abutting portion of the gate electrodes and contact plugs formed over the gate electrodes. FIG. 4 is a cross-sectional view in a C-C line in FIG. 1, showing a cross section of gate electrodes and a source/drain region of the MISFET constituting the SRAM shown in FIG. 1 and contact plugs formed over the electrodes and the region. The A-A line and B-B line in FIG. 1 are lines along the extending direction of the gate electrode (along the gate width direction), while the C-C line is a line perpendicular to the A-A line and the B-B line and along the gate length direction of the gate electrode. FIG. 5A is an equivalent circuit diagram of the SRAM in FIG. 1.

The SRAM is a volatile memory, which stores data by using a sequential circuit, such as a flip-flop, and which loses the memory content when the supply of electric power is stopped. Unlike a Dynamic Random Access Memory (DRAM), the SRAM is a memory circuit which requires no refresh operation because a flip-flop circuit is used in a storage section and which is capable of reducing the power consumption during memory retention. The types of the SRAM, as the structure of the memory cell, include a high-resistance load type including four transistors and two high-resistance elements and a Complementary MOS (CMOS) type including six transistors. In the embodiment, the CMOS type SRAM, which is reliable because the leakage current during data retention is very small and is the current mainstream, is described as an example.

FIG. 1, to facilitate the illustration of the drawing, shows a plurality of MISFETs each including a source/drain region formed in the upper surface of the semiconductor substrate and a gate electrode formed over the semiconductor substrate, a contact plug formed over each source/drain region and over the gate electrode, and an element isolation region formed in the upper surface of the semiconductor substrate, but shows neither other wirings nor interlayer insulating films. A region enclosed by a dotted line in FIG. 1 includes six MISFETs Q1 to Q6 constituting one SRAM. Over the semiconductor substrate, there are formed a number of SRAMs each having, as one unit, such a structure enclosed and indicated by the dotted line.

All the gate electrodes constituting the MISFETs Q1 to Q6 extend in a first direction along the major surface of the semiconductor substrate. A gate electrode G1 constituting MISFET Q1 and MISFET Q3 and a gate electrode G3 constituting MISFET Q6 are formed to be aligned in the first direction. A gate electrode G2 constituting MISFET Q2 and MISFET Q4 and a gate electrode G4 constituting MISFET Q5 are formed to be aligned in the first direction. On an extended line along which the gate electrode G1 extends, the gate electrode G3 is formed. On an extended line along which the gate electrode G2 extends, the gate electrode G4 is formed.

The edges facing each other of the gate electrodes G1 and G3 are adjacent to each other. In the present application, such a region (a gate edge portion facing each other) between the edges facing each other of the gate electrodes extending in the same direction and being aligned in this direction is referred to as an "abutting portion" of the gate electrodes. Similarly, the edges facing each other of the gate electrodes G2 and G4 are adjacent to each other, and there is also the abutting portion between the gate electrodes G2 and G4. The interval in the abutting portion of the gate electrodes in the first direction of the embodiment is set to 40 nm.

The gate electrodes G1 to G4 are electrodes formed in the same layer, in which the gate electrode G2 and the gate electrode G4 are aligned in a direction (in a second direction) perpendicular to the extending direction of the gate electrode G1 and along the major surface of the semiconductor substrate. Furthermore, the gate electrode G3 and the gate electrode G2 are formed to be adjacent to each other in the second direction. The first direction is the gate width direction of the gate electrodes G1 to G4 and the second direction is the gate length direction of the gate electrodes G1 to G4. On the lateral side in the second direction of the gate electrode G1, there is an abutting portion of the gate electrodes G2 and G4, and on the lateral side in the second direction of the gate electrode G2, there is an abutting portion of the gate electrodes G1 and G3.

Moreover, a gate electrode G5 is formed on the opposite side of the gate electrode G4 to sandwich the gate electrode G2. The gate electrode G5 has an abutting portion between the gate electrode G2 and the gate electrode G5, and constitutes a MISFET included in another SRAM. Furthermore, on a lateral side in the second direction of the gate electrode G1, where there is no gate electrodes G2 and G4, a gate electrode G6 is formed and constitutes a MISFET included in another SRAM.

MISFETs Q1 and Q3 include the gate electrode G1, MISFETs Q2 and Q4 include the gate electrode G2, MISFET Q5 includes the gate electrode G4, and MISFET Q6 includes gate electrode G3. A source region S3 which is a p-type semiconductor region is formed in the major surface of the semiconductor substrate in a region between the gate electrode G1 and the gate electrode G2, and a drain region D3 which is a p-type semiconductor region is formed to sandwich the gate electrode G1 in the major surface of the semiconductor substrate on the opposite side of the source region S3. The source region S3, the drain region D3, and the gate electrode G1 constitute MISFET Q3. Moreover, a source region S4 which is a p-type semiconductor region is formed in the major surface of the semiconductor substrate in a region between the gate electrode G1 and the gate electrode G2, and a drain region D4 which is a p-type semiconductor region is formed so as to sandwich the gate electrode G2 in the major surface of the semiconductor substrate on the opposite side of the source region S4. The source region S4, the drain region D4, and the gate electrode G2 constitute MISFET Q4. MISFETs Q3 and Q4 are p-channel field effect transistors.

A drain region D15 which is an n-type semiconductor region is formed in the major surface of the semiconductor substrate in a region between the gate electrode G1 and the gate electrode G4, and a source region S1 which is the n-type semiconductor region is formed to sandwich the gate electrode G1 in the major surface of the semiconductor substrate on the opposite side of the drain region D15. The drain region D15, the source region S1, and the gate electrode G1 constitute MISFET Q1. Furthermore, a source region S5 which is the n-type semiconductor region is formed to sandwich the gate electrode G4 in the major surface of the semiconductor substrate on the opposite side of the drain region D15. The drain region D15, the source region S5, and the gate electrode G4 constitute MISFET Q5.

Similarly, a drain region D26 which is the n-type semiconductor region is formed in the major surface of the semiconductor substrate in a region between the gate electrode G2 and the gate electrode G3, and a source region S2 which is the n-type semiconductor region is formed to sandwich the gate electrode G2 in the major surface of the semiconductor substrate on the opposite side of the drain region D26. The drain region D26, the source region S2, and the gate electrode G2 constitute MISFET Q2. Furthermore, a source region S6 which is the n-type semiconductor region is formed so as to sandwich the gate electrode G3 in the major surface of the semiconductor substrate on the opposite side of the drain region D26. The drain region D26, the source region S6, and the gate electrode G3 constitute MISFET Q6.

MISFETs Q1, Q2, Q5, and Q6 are n-channel field effect transistors. Moreover, MISFET Q1 and MISFET Q5 share the drain region D15, and MISFET Q2 and MISFET Q6 share the drain region D26.

In the first direction, the source region S3 is between the source region S4 and the drain region D15. Over the edge of the gate electrode G2 near the abutting portion of the gate electrode G2 and gate electrode G4 and over the source region S3, a columnar contact plug P2 extending perpendicularly to the major surface of the semiconductor substrate is continuously formed, and the contact plug P2 is electrically connected to each of the gate electrode G2 and the source region S3. Therefore, the gate electrode G2 and the source region S3 are electrically connected to each other (see FIG. 4). Similarly, over the edge of the gate electrode G1 near the gate electrode G3 and over the source region S4, the contact plug P1 is continuously formed and the gate electrode G1 and the source region S4 are electrically connected to each other via the contact plug P1.

Moreover, a contact plug PL is formed over each of the source regions S1, S2, S5, and S6, the drain regions D15, D3, D26, and D4, and the gate electrodes G3 and G4. The contact plug PL over the source region S1 and the contact plug PL over the source region S2 are electrically connected to each other by means of wiring in an upper layer (not illustrated), and supply the same electric potential to the source region S1 and the source region S2. The contact plug PL over the drain region D15 and the contact plug P2 are electrically connected to each other by means of wiring in an upper layer (not illustrated). Similarly, the contact plug PL over the drain region D26 and the contact plug P1 are electrically connected to each other by means of wiring in an upper layer (not illustrated).

The patterns of the gate electrodes G1 to G4 in FIG. 1 are not the ones formed by processing a film formed over the semiconductor substrate by one-time exposure and one-time etching, but are the ones formed by at least two-time exposure and at least two-time etching. This is the processing method used for the purpose of precisely micromachining the abutting portion of the gate electrodes. The gate electrode is separately processed by two-time patterning: patterning for forming the side wall along the first direction of the gate electrode; and patterning for forming the side wall along the second direction, and thus the interval in the abutting portion of the gate electrodes in the first direction can be reduced. In the embodiment, in forming the gate electrode, multiple times of patterning are performed in this manner. In the present application, among the multiple times of patterning, the patterning step in processing and forming the abutting portion of the gate electrodes is referred to as the "end-cut".

In the embodiment, in forming the gate electrodes G1 to G4, first to form the abutting portion of the gate electrodes in the first direction, the patterning ("end-cut") for forming the side wall along the second direction of each gate electrode is performed followed by performing the patterning for forming the side wall along the first direction of each gate electrode, and thus the major surface of the semiconductor substrate between the gate electrodes aligned in the second direction are exposed. However, the sequence of patternings in performing the "end-cut" is not limited to this sequence. On the contrary, the patterning for forming the side wall along the first direction of the gate electrode may be performed followed by performing the patterning ("end-cut") for forming the side wall along the second direction of each gate electrode.

Next, the configuration of the SRAM is described using FIG. 5A. As shown in an equivalent circuit diagram in FIG. 5A, the SRAM of the embodiment includes six MISFETs Q1 to Q6. The sources (the source regions S5 and S6 in FIG. 1) of MISFETs Q5, Q6 are connected to bit lines BL1 and BL2, respectively, and the gate electrodes (gate electrodes G3 and G4 shown in FIG. 1) of MISFETs Q5 and Q6 are connected to a word line WL.

The drain (the drain region D15 shown in FIG. 1) of MISFET Q5 is connected via a first node E1 to the drain (the drain region D15 in FIG. 1) of MISFET Q1, the source (the source region S3 in FIG. 1) of MISFET Q3, and the gates (the gate electrode G2 in FIG. 1) of MISFETs Q2 and Q4. Similarly, the drain (the drain region D26 in FIG. 1) of MISFET Q6 is connected via a second node E2 to the drain (the drain region D26 in FIG. 1) of MISFET Q2, the source (the source region S4 in FIG. 1) of MISFET Q4, and the gates (the gate electrode G1 in FIG. 1) of MISFETs Q1 and Q3.

Both the drains (the drain regions D3 and D4 in FIG. 1) of MISFETs Q3 and Q4 are connected to a power supply potential line Vdd, and both the sources (the source regions S1 and S2 in FIG. 1) of MISFETs Q1 and Q2 are connected to an earth potential line Vss. Both MISFETs Q5 and Q6 are the field effect transistors for transfer. MISFETs Q1 and Q2 and MISFETs Q3 and Q4 are Complementary MIS (CMIS) inverters formed by combining an n-channel transistor and a p-channel transistor, respectively. To write/read data, a flip-flop circuit is configured by cross-coupling the CMIS of MISFETs Q1 and Q2 and the CMIS of MISFETs Q3 and Q4.

A method of operating the SRAM is described below. In a write operation of the SRAM, the voltage of the word line WL in FIG. 5A is increased to turn on the gates of MISFETs Q5 and Q6. Then, if the voltage of a bit line BL1 is increased and reducing the voltage of a bit line BL2 is reduced, data "1" is stored in the first node E1 on the left side of the flip-flop circuit while data "0" is stored in the second node E2 on the right side of the flip-flop circuit. On the contrary, if the voltage of the bit line BL1 is reduced and the voltage of the bit line BL2 is increased, data "0" is stored in the first node E1 while data "1" is stored in the second node E2. Even if the voltage of the word line WL is reduced to 0 V, the written data of "1" or "0" will continue to be stored as long as the power supply of the device is turned on.

During data read operation, the voltage of the word line WL is increased to turn on the gates of MISFETs Q5 and Q6, and according to the stored state (a combination of "1" and "0" of the first node E1 and the second node E2), an electric potential difference occurs between the bit lines BL1 and BL2. This electric potential difference is amplified and detected by a sense amplifier.

As shown in FIG. 2, a p-well PW into which a p-type impurity (boron (B)) is introduced, and an element isolation region 2, are formed in the major surface of the semiconductor substrate 1 including single crystal silicon. Over the main surface of the semiconductor substrate 1, the gate electrodes G2 and G5 are formed via a gate insulating film 3 including a silicon oxide film. The p-well PW is formed directly under the gate electrodes G2 and G5, and the element isolation region 2 including a silicon oxide film is formed in the main surface of the semiconductor substrate 1 directly under the abutting portion between the edges facing each other of the gate electrodes G2 and G5. The gate electrodes G2 and 5 each include a metal gate layer MG including a titanium nitride (Tin) film, a polysilicon layer PG, and the like, which are sequentially stacked from the semiconductor substrate 1 over the gate insulating film 3. A silicide layer NS including nickel (Ni) and the like is formed over the polysilicon layer PG.

A sidewall SW with a stacked structure, in which a silicon oxide film 4 and a silicon nitride film 5 are sequentially stacked from the semiconductor substrate 1, is formed in the side walls of the gate electrodes G2 and G5. The sidewall SW occupies most of the region of the abutting portion, which is a region between the gate electrodes G2 and G5. An offset spacer 4a including a silicon oxide film is between the side walls and sidewalls SW of the gate electrodes G2 and G5.

The sidewall SW is formed in a self-aligning manner on the side walls of the gate electrodes G2 and G5. A side wall of the sidewall SW on a side not in contact with the gate electrode, and an upper surface of the sidewall SW have a continuous curved surface. Therefore, the interval between the sidewall SW of the side wall of the gate electrode G2 and the sidewall SW of the side wall of the gate electrode G5 increases as they are away from the major surface of the semiconductor substrate 1. Between the sidewalls SW, a liner insulating film 6 formed to cover the major surface of the semiconductor substrate including the gate electrodes G2 and G5 is formed. The sidewalls SW and the offset spacer 4a are formed between the liner insulating film 6 and the side walls of the gate electrodes G2 and G5.

The liner insulating film 6 is an insulating film including a silicon nitride (SiN) film, and serves as an etching stopper film in forming contact holes into which the contact plugs P1, P2, PL and the like in FIG. 1 are embedded. The liner insulating film 6 is formed between the adjacent gate electrodes in the first direction, as shown in FIG. 2. Moreover, as shown in FIG. 4, the liner insulating film 6 is also formed in the upper surface of each gate electrode and in the upper surface of the semiconductor substrate 1 exposed from the sidewall SW formed on the side wall of the gate electrode, on the lateral sides of each gate electrode in the second direction. The lowest position of the upper surface of the liner insulating film 6 over the abutting portion of the gate electrodes G2 and G5 is higher than the upper surface of the gate electrodes G2 and G5. Moreover, an interlayer insulating film 7, a stopper insulating film 8, and an interlayer insulating film 9 are sequentially formed from the major surface of the semiconductor substrate over the liner insulating film 6. The interlayer insulating films 7 and 9 include a silicon oxide film. The stopper insulating film 8 includes a silicon nitride film. The stopper insulating film 8 is an insulating film which serves as an etching stopper film in forming a wiring groove for embedding a metal wiring into the interlayer insulating film 9.

As shown in FIG. 3, the cross section, including the gate electrodes G1 and G3, has a structure similar to that in FIG. 2. However, the contact plugs P1 and PL are formed directly above the gate electrodes G1 and G3, respectively, and the element isolation region 2 is formed in the major surface of the semiconductor substrate 1 directly under the contact plug P1. The gate electrodes G1 and G3 including the metal gate layer MG and the polysilicon layer PG are electrically connected to the contact plugs P1 and PL via the silicide layer NS formed over the polysilicon layer PG, respectively. The contact plugs P1 and PL are electrically connected to the metal wiring M1 formed over them.

The silicide layer NS has a function to reduce a contact resistance between the contact plug and the gate electrode as well as that between the contact plug and the source/drain region by being interposed between the contact plug and the gate electrode as well as between the contact plug and the source/drain region. The silicide layer NS is a reaction layer of metal and silicon. Its material can include Nickel silicide, cobalt silicide, platinum silicide, and titanium silicide.

The contact plugs P1 and PL are connection members formed via a barrier conductive film (not illustrated) which is formed on an inner wall and at a bottom part of a contact hole 7a. The contact plugs P1 and PL include tungsten, and the barrier conductive film formed on the side wall and bottom part includes titanium nitrides.

The metal wiring M1 is a wiring for supplying a predetermined electric potential to MISFETs constituting the SRAM, and is formed by the damascene process. The metal wiring M1 includes a barrier conductive film formed on the inner wall and at the bottom part of the wiring groove 9a; and a metal film with which the inside of the wiring groove 9a is filled via the barrier conductive film. The barrier conductive film includes a stacked film of tantalum (Ta) and tantalum nitride (TaN), and the metal film is a film including copper (Cu) as a principal component. The barrier conductive film is provided to prevent a metallic element inside the metal film from diffusing into the interlayer insulating film 9 and the like. Titanium (Ti), ruthenium (Ru), manganese (Mn), their compound, or the like other than tantalum may be used as the member of the barrier conductive film.

As with the structure shown in FIG. 2, in the abutting portion of the gate electrodes G1 and G3, the sidewall SW is formed in the side walls facing each other of the gate electrodes G1 and G3, respectively. The sidewalls SW are formed to be approximately in contact with each other. For this reason, the abutting portions of gate electrodes have no enough space for the liner insulating film 6 to be embedded, and the lowest position of the upper surface of the liner insulating film 6 directly above the abutting portion is higher than the upper surface of the gate electrodes G1 and G3. Therefore, the upper surface of the liner insulating film 6 over the abutting portion has no large irregularity but has a relatively flat shape.

As shown in FIG. 4, the cross section along the second direction in the C-C line in FIG. 1 shows a cross section including the gate electrode G1, source region S3, and drain region D3 constituting the MISFET Q3. The element isolation region 2 and an n-well NW, which is an n-type semiconductor region and into which an n-type impurity (phosphorus (P)) is introduced, are formed in the major surface of the semiconductor substrate 1. Over the semiconductor substrate 1, the gate electrodes G2 and G1, and G6 are formed via the gate insulating film 3, and on the side wall on both sides of each gate electrode, the sidewall SW is formed via the offset spacer 4a. In the major surface of the semiconductor substrate 1 on both sides of the gate electrode G1, the source region S3 and the drain region D3 are formed to sandwich the n-well NW directly under the gate electrode G1.

The source region S3 and the drain region D3 each include a diffusion layer PS, which is a semiconductor region and into which a p-type impurity (boron (B)) is introduced at a high concentration, with a deep junction depth; and a p$^-$-type semiconductor region PE, which is a semiconductor region and into which a p-type impurity (boron (B)) is introduced at a concentration lower than that of the diffusion layer PS, with a junction depth shallower than the diffusion layer PS. The p⁻-type semiconductor region PE is formed on the n-well NW under the sidewall SW, and the diffusion layer PS is formed in a self-aligning manner in the upper surface of the n-well NW exposed from the gate electrodes G1, G2, and G6 and the sidewall SW. Directly under the gate electrode G2 and one sidewall SW on one side wall, the element isolation region 2 is formed. On the major surface of the semiconductor substrate 1, the n-well NW is not formed.

The silicide layer NS is formed in the upper surfaces of the diffusion layer PS and the gate electrodes G1 and G2, and G6, the contact plug PL is formed via the silicide layer NS over the diffusion layer PS constituting the drain region D3, and the contact plug P2 is formed via the silicide layer NS over the diffusion layer PS constituting the source region S3 and over the gate electrode G2. The contact plug P2 is continuously and integrally formed from the upper surface of the gate electrode G2 to the upper surface of diffusion layer PS constituting the source region S3, and is also formed to cover a side wall of the gate electrode G2, the side wall being near the gate electrode G1.

As with the structure shown in FIG. 3, the contact plugs P2 and PL shown in FIG. 4 are formed inside the contact hole 7a penetrating the liner insulating film 6 and the interlayer insulating film which are sequentially formed over the major surface of the semiconductor substrate 1 including the gate electrodes G1 and G2 and the sidewall SW. The stopper insulating film 8 and the interlayer insulating film 9 are sequentially formed over the respective contact plugs P2 and PL. A plurality of metal wirings M1 is formed in the wiring groove 9a penetrating the interlayer insulating film 9 and the stopper insulating film 8. The drain region D3 is electrically connected to the metal wiring M1 via the silicide layer NS and the contact plug PL. Moreover, the gate electrode G2 and the source region S3 of MISFET Q3 are electrically connected to each other via the silicide layer NS and the contact plug P2.

The gate electrodes G1 and G2 shown in FIG. 4, as with the gate electrode shown in FIG. 2 and FIG. 3, include the metal gate layer MG and the polysilicon layer PG formed over the metal gate layer MG. Unlike FIG. 2 and FIG. 3, the abutting portion of gate electrodes is not shown in FIG. 4, and the interval between the adjacent gate electrodes G1 and G2 in the second direction is wider than the abutting portion shown in FIG. 2 and FIG. 3. This is because the source/drain region and the contact plug are formed between the gate electrodes. Accordingly, unlike the abutting portion of the gate electrodes in the first direction, between the adjacent gate electrodes in the second direction, the interval between the sidewalls SW is wider than the abutting portion of the adjacent gate electrodes in the second direction. The liner insulating film 6 is widely formed on the major surface of the semiconductor substrate without via the gate electrode or the sidewall SW. The lowest upper-surface of the liner insulating film 6 of the abutting portion of the adjacent gate electrodes in the first direction shown in FIG. 2 is higher than the lowest upper-surface of the liner insulating film 6 between the adjacent gate electrodes in the second direction shown in FIG. 4.

Next, the effect of the semiconductor device of the embodiment is described. Like the SRAM shown in FIG. 1, in the semiconductor device, in which a plurality of gate electrodes are aligned in the first direction, there is a problem in which the embeddability of the insulating film in the abutting portion between gate electrodes degrades because the device is miniaturized and the abutting portion of gate electrodes is formed at an interval between the gate electrodes of as small as about 30 to 50 nm. The "insulating film in the abutting portion" refers to the liner insulating film 6 shown in FIG. 2 and FIG. 3. In the abutting portion where the interval between gate electrode patterns is small, a void is likely to be generated inside the liner insulating film 6 of the abutting portion because it is difficult to densely embed a deep groove between gate electrodes with the liner insulating film 6.

Figure 24:
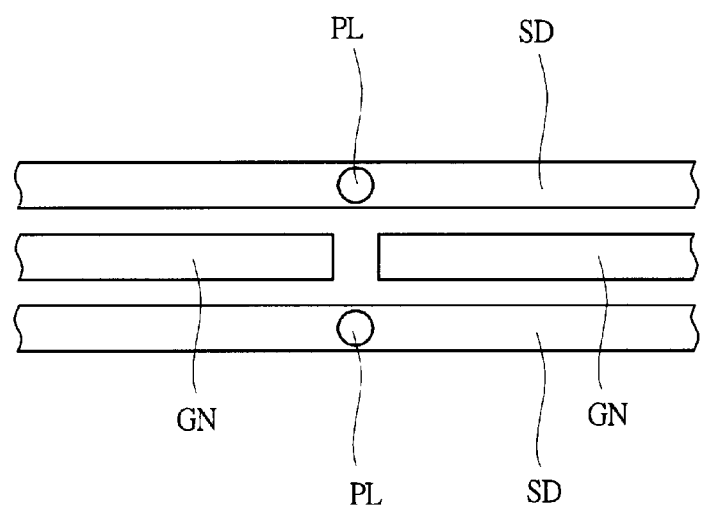
FIG. 24 is a layout of a semiconductor device which is a comparative example.

To describe the configuration which is most likely to cause a problem when the above-mentioned void is generated, a layout drawing showing a gate electrode and a source/drain region of a semiconductor device, which is a comparative example, is shown in FIG. 24. FIG. 24 shows a plurality of gate electrodes GN, which are formed over a semiconductor substrate (not illustrated) and extend in a first direction along the major surface of a semiconductor substrate; two source/drain regions SD formed on the major surface of the semiconductor substrate to sandwich the gate electrode GN in a second direction perpendicular to the first direction; and the contact plug PL formed over each source/drain region SD. As with the semiconductor device of the embodiment shown in FIG. 1, a plurality of gate electrodes GN are aligned in the first direction, which is the extending direction of each gate electrode GN, and the interval between the edges facing each other of the adjacent gate electrodes GN (the interval in the abutting portions) is as short as about 40 nm. The "end-cut" is used in forming the abutting portion of the gate electrodes.

In FIG. 24, the source/drain region SD is formed extending in the first direction to be along the gate electrode GN extending in the first direction. The gate electrode GN is intermittently formed so that the pattern extending in the first direction breaks up along the way. On the contrary, the source/drain region SD does not break up even in the vicinity of the abutting portion, where the gate electrode GN brakes up. In the region shown in FIG. 24, the source/drain region SD is continuously formed along the gate electrodes GN and the abutting portion between the gate electrodes GN.

The source/drain region SD is formed on the major surface of the semiconductor substrate to sandwich the abutting portion of the gate electrodes GN in the second direction. Moreover, over each source/drain region SD, the contact plug PL is formed to sandwich the abutting portion. One contact plug PL, the abutting portion, and the other contact plug PL are aligned in the second direction. Between the contact plugs PL over the respective source/drain regions SD which are arranged to sandwich the gate electrode GN, there is a region in which the gate electrode GN is not formed. Although not illustrated, over the major surface of the semiconductor substrate, an insulating film is formed to cover the source/drain region SD and the gate electrode GN. The insulating film is formed also in the abutting portion of the gate electrodes which is the region between the contact plugs PL. The contact plug PL extends through the insulating film and is connected to the source/drain region SD.

Figure 25:
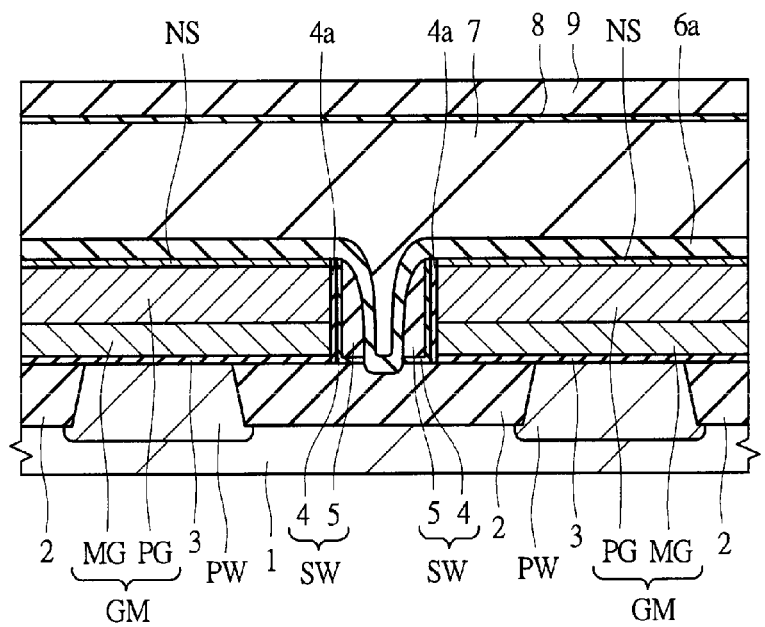
FIG. 25 is a cross-sectional view of the semiconductor device which is the comparative example.

Moreover, FIG. 25 shows a cross-sectional view of a semiconductor device which is another comparative example. FIG. 25 is a cross-sectional view along the first direction, including the region between the edges facing each other of two gate electrodes GM extending in the first direction along the major surface of the semiconductor substrate 1. The gate electrode GM of the semiconductor device of the comparative example shown in FIG. 25 is patterned by two-time etching using the "end-cut", and the distance between the adjacent gate electrodes GM in the first direction is 40 nm.

As with the semiconductor device of the embodiment shown in FIG. 2, the gate electrode GM and the sidewall SW on the side wall of the gate electrode GM shown in FIG. 25 have a stacked structure. Moreover, as with the layout in FIG. 24, on the lateral side of the abutting portion of the gate electrodes GM shown in FIG. 25 and in the second direction perpendicular to the first direction, a contact plug (not-illustrated) is formed to sandwich the abutting portion. The insulating film described using FIG. 24 corresponds to the liner insulating film 6a in FIG. 25.

As shown in FIG. 25, because the sidewalls SW of the side walls of the gate electrodes GM are away from each other, a groove which exposes the upper surface of the semiconductor substrate 1 is formed in the abutting portion of the gate electrodes GM. The upper surface of the liner insulating film 6a has a significantly dented shape in the abutting portion. Specifically, the upper surface of the liner insulating film 6a is lower than the upper surface of the gate electrode GM in the abutting portion, the region being near the upper surface of the semiconductor substrate 1. The reason why the major surface of the semiconductor substrate 1 is partially dented in the abutting portion of the gate electrodes GM is that a part of the upper surface of the semiconductor substrate 1 is partially removed by the etching step or the like for forming the sidewall SW. Accordingly, not limited to the upper surface of the abutting portion, the upper surface of the semiconductor substrate 1 on the lateral side in the second direction of the gate electrode GM is also partially dented.

This is because in the abutting portion of the gate electrodes GM, the liner insulating films 6a formed from the upper surfaces to side walls, of the sidewalls SW facing each other, are not in contact with each other and the liner insulating films 6a do not close the space in the abutting portion. In the abutting portion, in any region, the distance between the sidewalls SW facing each other is longer than twice the thickness in the first direction of the liner insulating film 6a formed on the side wall of the sidewall SW.

It should be noted that, the film thickness of the liner insulating film 6a is about 20 nm over the upper surface of the gate electrode and is about 10 to 15 nm on the major surface of the semiconductor substrate 1 exposed from the sidewall SW of the abutting portion. The thickness of the liner insulating film 6a formed on the surface of the sidewall SW gradually decreases from the upper portion to lower portion of the surface of the sidewall SW. In the portion where the liner insulating film 6a is thinnest, the thickness of the liner insulating film. 6a in a direction perpendicular to the surface of the sidewall SW is about 10 nm. The "thickness" refers to the distance from the lower surface to upper surface of the liner insulating film 6a in a direction perpendicular to the underlying surface in contact with the lower surface of the liner insulating film 6a.

When the liner insulating film 6a is formed over the semiconductor substrate 1 using Chemical Vapor Deposition (CVD) or the like, the liner insulating film 6a formed on the side wall of the pattern of the gate electrode GM or the like is thinner than the liner insulating film 6a formed in a surface parallel to the major surface of the semiconductor substrate 1, such as the surface over the major surface of the semiconductor substrate 1 in which the area larger than that of the abutting portion is exposed, or the surface over the gate electrode GM. This is because the coverage of the insulating film formed on the side wall of the pattern becomes worse than that of the insulating film formed in a surface such as the upper surface of the gate electrode GM. This is true of the case where the liner insulating film 6a is formed on the side wall of the gate electrode GM via the sidewall SW.

When the coverage of the liner insulating film is 100%, the liner insulating film formed on the upper surface of the gate electrode is as thick as the film thickness of the liner insulating film formed on the side wall of the gate electrode, in any region. The coverage tends to degrade particularly on the inner wall of a narrow groove. If the coverage is poor, the liner insulating film of the side wall of the gate electrode thins as it approaches from an upper portion to lower portion of the side wall.

If the abutting portion of the gate electrodes GM, over which the liner insulating film 6a is formed, has a short interval of about 30 to 50 nm, and the interval between the sidewalls SW facing each other is short, and the upper surface of the semiconductor substrate 1 exposed between the sidewalls SW is small, the liner insulating film 6a over the semiconductor substrate 1 exposed from the sidewall SW in the abutting portion is also thinner than the liner insulating film 6a over the gate electrode GM.

As shown in FIG. 25, if a deep groove is formed from the upper surface of the gate electrode GM in the abutting portion of the gate electrodes GM to the upper surface of the semiconductor substrate 1, the coverage of the liner insulating film 6a between the sidewalls SW facing each other degrades and the above-mentioned void is likely to be formed inside the liner insulating film 6a. FIG. 25 shows no void.

In the semiconductor device of such a comparative example, relative to the lowest position of the upper surface of the liner insulating film 6a between the adjacent gate electrodes in the first direction shown in FIG. 25, the lowest position of the upper surface of the liner insulating film 6a formed on the upper surface of the gate electrode GM on the lateral side in the second direction of the gate electrode GM and the semiconductor substrate 1 exposed from the sidewall SW of the side wall of the gate electrode GM may be higher. This is because at the bottom part of the narrow groove, such as the abutting portion of the gate electrodes GM, the coverage of the liner insulating film 6a degrades and the film becomes thinner than the film formed in a wide region, like the liner insulating film 6a on the upper surface of the semiconductor substrate 1 on the lateral side in the second direction of the gate electrode GM.

In the semiconductor device with the configuration as shown in FIG. 24 and FIG. 25, when a void is formed inside the insulating film (the liner insulating film 6a shown in FIG. 25) formed in the abutting portion of the gate electrodes GN as described above, there is a problem in which the contact plugs PL adjacent to each other by sandwiching the abutting portion are short-circuited via a metal member formed inside the void, and thus the semiconductor device does not normally operate. If a short-circuit failure occurs, the reliability of the semiconductor device degrades and the yield degrades. This is because after the insulating film (liner insulating film) having a void is formed in the abutting portion, two contact holes penetrating the insulating film and the interlayer insulating film formed over the insulating film are formed to sandwich the abutting portion, and then, in filling a metallic material constituting the contact plug PL into each contact hole, the void is also filled with the metallic material and two contact plugs PL are connected to each other via the void.

When the insulating film formed in the abutting portion includes a void, if the contact plug is formed near the abutting portion and laterally on both sides in the second direction of the adjacent gate electrodes in the first direction and the abutting portion between the gate electrodes, the respective contact plugs may be short-circuited via a metal member formed inside the void.

Such a problem is likely to occur particularly in the structure in which the contact plugs PL are adjacent to each other to sandwich the abutting portion, as shown in FIG. 24. Also in the structure as shown in FIG. 1, the contact plug P2 and the contact plug PL over the source region S5 may be short-circuited via avoid inside the insulating film formed in the abutting portion between the gate electrode G2 and the gate electrodes G4. When the contact plug connected to the source/drain region is formed near the abutting portion and on both sides of the liner insulating film 6 formed in the abutting portion, if a void is formed inside the liner insulating film 6, a short-circuit will occur between the contact plugs.

Although in the semiconductor device of the embodiment as shown in FIG. 1, the gate electrodes are aligned in the second direction, the interval between the gate electrodes aligned in the second direction is longer than the abutting portion of the gate electrodes in the first direction. The embeddability of the liner insulating film 6 (see FIG. 4) is better than that in the abutting portion, and thus no void occurs between gate electrodes. This is because the problem of the void generation becomes more prominent when the interval in the abutting portion is as short as about 30 to nm. Accordingly, as with the comparative example described by using FIG. 24 and FIG. 25 and the embodiment shown in FIG. 1, when the gate electrode is formed by using the "end-cut" for micromachining of the abutting portion, the interval between the gate electrodes can be formed to be short, and thus a short-circuit between the contact plugs caused by the generation of the above-mentioned void is more likely to occur.

Moreover, like the SRAM shown in FIG. 1, for example, in a semiconductor device in which the interval between the gate electrodes in the first direction is formed to be small by using the "end-cut", a layout in which the contact plugs are arranged to sandwich the abutting portion of the gate electrodes is likely to be formed in a certain region over the semiconductor substrate, as shown in FIG. 24. In contrast, to prevent the generation of the above-mentioned short-circuit, if a layout in which the contact plugs are arranged so as to sandwich the abutting portion of the gate electrodes as shown in FIG. 24, is not formed, problems such as an increase in the area of the semiconductor device occur because the degree of freedom of layout of the semiconductor element decreases.

Moreover, a method can be considered, in which in order to prevent the generation of the above-described short-circuit, the interval in the abutting portion is widened as in the case of the interval between the adjacent gate electrodes in the second direction shown in FIG. 1. In this case, it is difficult to miniaturize the semiconductor device because the interval in the abutting portion of the gate electrodes cannot be shortened.

In the region where the interval between the gate terminals is formed is as short as about 30 to 50 nm, the larger the height from the upper surface of the gate electrode to the major surface of the semiconductor substrate, the larger the depth of the groove in the abutting portion, the more likely the above-mentioned void inside the insulating film is formed. When a deep groove is embedded with the liner insulating film 6, a void is likely to be generated. In contrast, in the embodiment, as shown in FIG. 2, the sidewalls SW facing each other are formed close to each other so that the sidewalls SW of the abutting portion between the adjacent gate electrodes in the first direction are almost in contact with each other, by reducing the size of the groove, into which the liner insulating film 6 formed in the abutting portion is embedded. This allows preventing the coverage of the liner insulating film 6 from degrading and suppressing the formation of a void inside the liner insulating film 6. On the sidewalls SW facing each other in the abutting portion, the parts of the side faces may be in contact with each other and integrated into one.

In the semiconductor device shown in FIG. 2, a large recess will not be formed on the upper surface of the liner insulating film 6 in the abutting portion, and the liner insulating film 6 is formed to be flatter than the liner insulating film 6a shown in FIG. 25. Therefore, the lowest upper-surface of the liner insulating film 6 is higher than the upper surfaces of the gate electrodes G2 and G5. The height of the lowest upper-surface of the liner insulating film 6 in the abutting portion between the adjacent gate electrodes in the first direction shown in FIG. 2 is higher than the lowest upper-surface of the liner insulating film 6 between the adjacent gate electrodes in the second direction shown in FIG. 4. In a plurality of gate electrodes extending in the same direction (the first direction), the gate electrodes being formed over the semiconductor substrate, and in a semiconductor device with the gate electrodes, the lowest position of the upper surface of the insulating film between the gate electrodes aligned in the gate width direction (first direction) is higher than the lowest position of the upper surface of the insulating film between the gate electrodes in a gate length direction (second direction).

This is because the sidewalls SW facing each other in the abutting portion approach each other and accordingly the liner insulating films 6 formed from the upper surface to side wall of the sidewall SW come in contact with each other between the sidewalls SW facing each other to close the space between the sidewalls SW. In the abutting portion, there is a region, where the distance between the sidewalls SW facing each other is equal to or shorter than twice the thickness in the first direction of the liner insulating film 6 formed on the side wall of the sidewall SW. Therefore, as compared with the comparative example described using FIG. 24 and FIG. 25, the flatness of the liner insulating film 6 over the abutting portion is improved and the degradation of the coverage of the liner insulating film 6 is suppressed, thereby preventing a void from being generated inside the liner insulating film 6.

The above-mentioned configuration is expressed by Formula (1) below.

$$S_1 \leq 2\times(a+\alpha t) \tag{1}$$

Figure 5B:
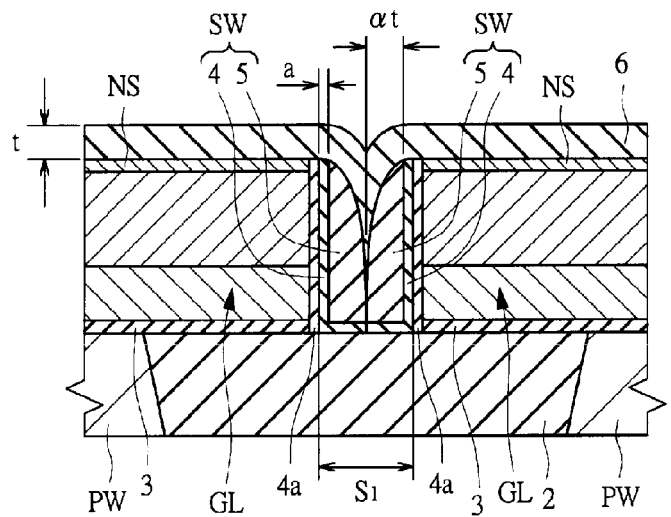
FIG. 5B is a cross-sectional view of the semiconductor device of Embodiment 1.

Where, as shown in FIG. 5B, $S_1$ is the distance between the adjacent gate electrodes GL in the first direction. However, when the offset spacer 4a is formed on the side wall of the gate electrode GL, $S_1$ is the distance between the offset spacers 4a facing each other. "a" is the width at the upper end of the sidewall SW. Because most of the silicon nitride film 5 is removed at the upper end of the sidewall SW, "a" shown in Formula (1) can be considered as the thickness in the first direction of the silicon oxide film 4. "α" is the coverage (%) of the liner insulating film 6 at the edge in the first direction of the upper surface of the gate electrode GL, and "t" is a setting of thickness of the liner insulating film 6. "αt" is the thickness of the liner insulating film of the side wall of the sidewall SW. FIG. 5B is a cross-sectional view of the semiconductor device in accordance with the embodiment to explain Formula (1). The semiconductor device shown in FIG. 5B has the same structure as the semiconductor device shown in FIG. 2, but the structure formed above the liner insulating film 6 is not shown in FIG. 5B.

In the embodiment, by designing the structural parameters to satisfy Formula (1), the liner insulating film 6 is caused to close the space in the abutting portion, preventing the liner insulating film 6 from being formed in the lower portion of a deep groove in the abutting portion. Because the above-mentioned void is likely to be generated when the liner insulating film 6 is formed in the lower portion of a deep groove, the formation of the liner insulating film 6 in the lower portion of the abutting portion is prevented to eliminate a need to fill the deep groove with the liner insulating film 6 and prevent a void from being generated.

Accordingly, in the semiconductor device of the embodiment, it is possible to prevent a void from being formed inside the insulating film of the abutting portion and to prevent a plurality of contact plugs formed on both sides of a plurality of gate electrodes GL extending in the direction along the major surface of the semiconductor substrate and on both sides of the abutting portion between the gate electrodes GL from being short-circuited via a metal member formed inside a void. This enables to prevent a semiconductor element, such as an SRAM, from not normally operating and to improve the reliability of the semiconductor device.

It should be noted that the liner insulating film 6 formed under the conditions satisfying Formula (1) closes the space between the gate electrodes GL facing each other near the upper end of the side wall of the gate electrodes GL facing each other in the abutting portion (at a position higher than the upper surface of the gate electrode GL), not in the lower portion of the side wall of the sidewalls SW facing each other. In this case, as compared with the case where the liner insulating film 6 closes the space at a position lower than the upper surface of the gate electrode GL (the case where the lowest position of the upper surface of the liner insulating film 6 of the abutting portion is lower than the upper surface of the gate electrode GL), the liner insulating film 6 is formed to be flatter in the abutting portion and a void is unlikely to be formed in the film.

Moreover, as described using FIG. 25, even though a part of the upper surface of the semiconductor substrate 1 is removed by the etching step for forming the sidewall SW and the upper surface is thus formed into a shape, such as a dent, in the semiconductor device in accordance with the embodiment the lowest upper-surface of the liner insulating film 6 of the abutting portion of the adjacent gate electrodes in the first direction shown in FIG. 2 is in a region higher than the lowest upper-surface of the liner insulating film 6 between the adjacent gate electrodes in the second direction shown in FIG. 4.

Next, the manufacturing process of the semiconductor device of the embodiment will be described with reference to the drawings. FIG. 6, FIG. 7, FIG. 9, and FIG. 11 to FIG. 17 are cross-sectional views during the manufacturing process of a semiconductor device, such as a semiconductor device with an SRAM, of one embodiment of the present invention. FIG. 6A, FIG. 7A, FIG. 9A, FIG. 11A, FIG. 12A, FIG. 13A, FIG. 14A, FIG. 15A, FIG. 16A, and FIG. 17A are cross-sectional views in the same cross section as in FIG. 2. Moreover, FIG. 6B, FIG. 7B, FIG. 9B, FIG. 11B, FIG. 12B, FIG. 13B, FIG. 14B, FIG. 15B, FIG. 16B, and FIG. 17B are cross-sectional views in the same cross section as in FIG. 4.

Figure 10:
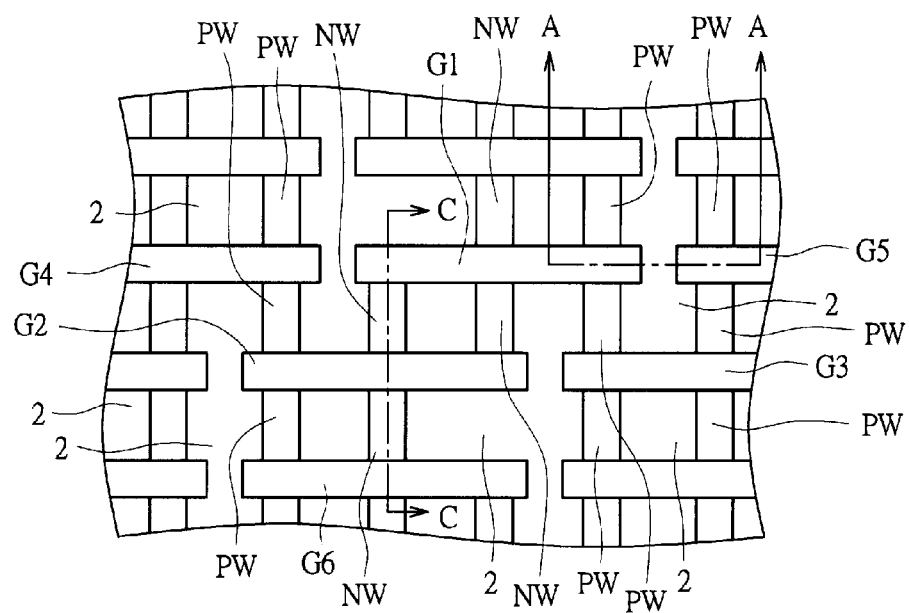
FIG. 10 is a layout during a manufacturing process of the semiconductor device following FIG. 9A and FIG. 9B.

FIG. 8 and FIG. 10 are layouts during the manufacturing process of a semiconductor device, such as a semiconductor device with an SRAM, of one embodiment of the present invention.

Figure 6A:
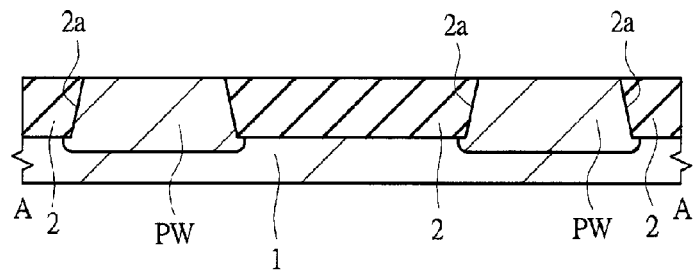
FIG. 6A is a cross-sectional view for illustrating a manufacturing process of the semiconductor device of Embodiment 1.
Figure 6B:
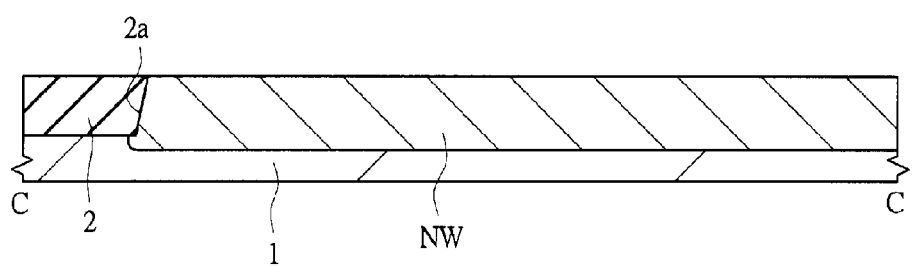
FIG. 6B is a cross-sectional view for illustrating the manufacturing process of the semiconductor device of Embodiment 1.

First, as shown in FIG. 6A and FIG. 6B, the semiconductor substrate (semiconductor wafer) 1 including p-type single crystal silicon with the resistivity of approximately 1 to 10 Ωcm is prepared. Next, the semiconductor substrate 1 is thermally oxidized to form a first insulating film with a thickness of about 11 nm on its surface, and subsequently a second insulating film with a thickness of about 90 nm is deposited in an upper layer thereof by CVD or the like. The first insulating film includes silicon oxide, and the second insulating film includes a silicon nitride film. Then, by sequentially dry-etching the second insulating film, the first insulating film, and the semiconductor substrate 1 using a photoresist pattern (not illustrated) as an etching mask, a groove (groove for element isolation) 2a with a depth of approximately 300 nm is formed in an element isolation formation region of the semiconductor substrate 1. The groove 2a is a groove for element isolation (a groove for forming the element isolation region 2 to be described).

Next, over the major surface of the semiconductor substrate 1 including the inside (the side wall and the bottom part) of the groove 2a, a third insulating film with a thickness of about 10 nm is formed. Then, over the major surface of the semiconductor substrate 1 (over the third insulating film), a fourth insulating film is formed (deposited) to fill the groove 2a by CVD or the like.

The third insulating film includes a silicon oxide film or a silicon oxynitride film. When the third insulating film is the silicon oxynitride film, the volume expansion by the oxidation of the side wall of the groove 2a due to heat treatments of the third-insulating film forming step and can be effectively prevented and the compression stress acting on the semiconductor substrate 1 can be effectively reduced.

The fourth insulating film is a silicon oxide film deposited by High Density Plasma CVD (HDP-CVD), an $O_3$-TEOS oxide film, or the like. The $O_3$-TEOS oxide film is the silicon oxide film formed by thermal CVD using ozone ($O_3$) and tetraethoxysilane, also referred to as tetra ethyl ortho silicate, (TEOS) as the material gas (source gas).

Then, the fourth insulating film embedded into the groove 2a is annealed by heat treating the semiconductor substrate 1 at about 1150° C., and subsequently the fourth insulating film is polished by Chemical Mechanical Polishing (CMP) to expose the second insulating film, and the second insulating film is removed by wet etching using hot phosphoric acid or the like. Subsequently, using HF or the like, the fourth insulating film and the first insulating film outside the groove 2a are removed and the third insulating film and the fourth insulating film inside the groove 2a are left. Then, the element isolation region (element isolation) 2 is formed.

In this manner, the element isolation region 2 including the third insulating film and fourth insulating film embedded into the groove 2a is formed. In the embodiment, the element isolation region 2 is preferably formed by Shallow Trench Isolation (STI), not by Local Oxidization of Silicon (LOCOS). The element isolation region 2 of the embodiment preferably includes an insulator (the third insulating film and the fourth insulating film) embedded into the groove 2a for element isolation formed on the semiconductor substrate 1. An n-channel MISFET to be described later (a gate insulating film, a gate electrode, and an n⁻-type semiconductor region and n⁺-type semiconductor region for source/drain constituting the n-channel MISFET) and a p-channel MISFET (a gate insulating film, a gate electrode, and a p⁻-type semiconductor region and p⁺-type semiconductor region for source/drain constituting the p-channel MISFET) are formed in an active region defined (enclosed) by the element isolation region 2, respectively.

Next, a p-well PW (see FIG. 6A) and an n-well NW (see FIG. 6B) are formed from the major surface of the semiconductor substrate 1 down to a predetermined depth. The p-well PW is a p-type semiconductor region, which can be formed by ion-implanting a p-type impurity, such as boron (B), into an n-channel MISFET forming region of the semiconductor substrate 1 with a photoresist film (not illustrated) covering a p-channel MISFET forming region as an ion-implantation blocking mask. The N-well NW is an n-type semiconductor region, which can be formed by ion-implanting an n-type impurity, such as phosphorus (P) or arsenic (As), into the p-channel MISFET forming region of the semiconductor substrate 1 with another photoresist film (not illustrated) covering the n-channel MISFET forming region as an ion-implantation blocking mask. The p-well PW and the n-well NW are sequentially formed because they cannot be formed simultaneously, whichever may be formed first.

Figure 7A:
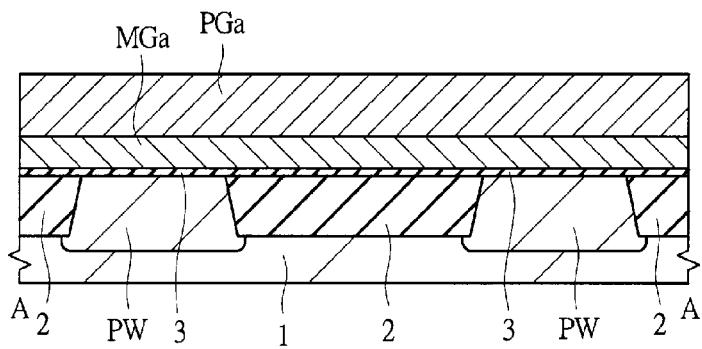
FIG. 7A is a cross-sectional view during a manufacturing process of the semiconductor device following FIG. 6A.
Figure 7B:
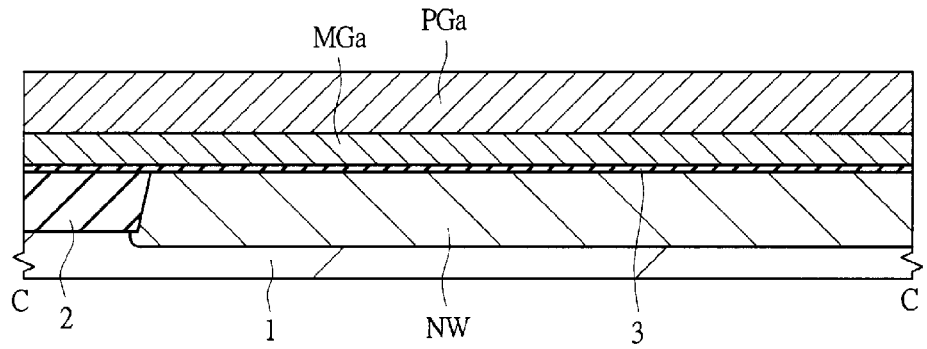
FIG. 7B is a cross-sectional view during a manufacturing process of the semiconductor device following FIG. 6B.

Next, as shown in FIG. 7A and FIG. 7B, the surface of the semiconductor substrate 1 is cleaned by wet etching using hydrofluoric acid (HF) solution or the like, and subsequently the gate insulating film 3 is formed over the surface (the surfaces of the p-well PW and n-well NW) of the semiconductor substrate 1. The gate insulating film 3 includes a thin silicon oxide film or the like, and can be formed by thermal oxidation or the like.

Next, over the semiconductor substrate 1 (over the gate insulating film 3 of the p-well PW and n-well NW), a metal layer MGa and a polysilicon layer PGa are sequentially stacked from the semiconductor substrate 1, as the conductive film for gate electrode formation. The metal layer MGa includes a titanium nitride (TiN) film, and is formed over the semiconductor substrate 1 by sputtering. The polysilicon layer PGa, which is an amorphous silicon film when deposited, may be turned into a polysilicon film by heat treatment after deposition (after ion implantation).

Next, as shown in FIG. 8, FIG. 9A, and FIG. 9B, by patterning the metal layer MGa, the polysilicon layer PGa, and the gate insulating film 3 using a photolithography method and a dry etching method, a part of the major surface of the semiconductor substrate 1 with the element isolation region 2 is exposed. FIG. 8 is a layout for explaining the manufacturing process of the semiconductor device. FIG. 9A is a cross-sectional view in the A-A line in FIG. 8, and FIG. 9B is a cross-sectional view in the C-C line in FIG. 8.

This patterning is the step for forming the gate electrode extending in the first direction along the major surface of the semiconductor substrate, but, as shown in FIG. 8, only a part of the side wall of the gate electrode formed in a subsequent step is formed. The gate electrode formed in the subsequent step includes a side wall extending in the first direction in plane view and a side wall along the second direction, and has a rectangular shape. In this patterning, only the side wall along the second direction is formed. Thus, the upper surface of the element isolation region 2 is exposed from the polysilicon layer PGa formed over the semiconductor substrate, at multiple places.

A plurality of gate electrodes is formed to be aligned in the first direction, and thus in FIG. 9A which is the cross-sectional view showing the abutting portion of the gate electrodes, a part of each of the metal layer MGa, the polysilicon layer PGa, and the gate insulating film 3 is removed. However, in FIG. 9B, which is the cross-sectional view along the second direction and shows the region where the gate electrode is formed, the metal layer MGa, the polysilicon layer PGa, and the gate insulating film 3 are not removed.

Figure 11A:
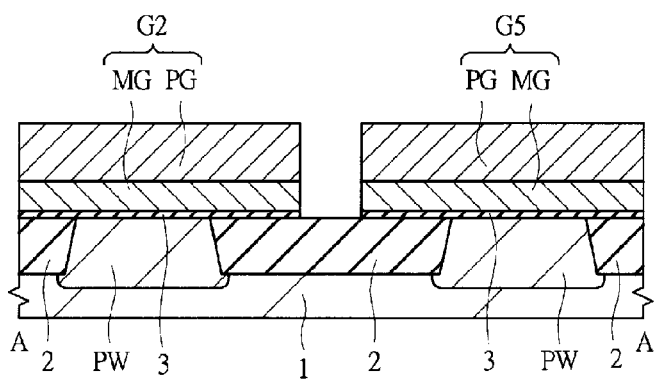
FIG. 11A is a cross-sectional view during a manufacturing process of the semiconductor device following FIG. 9A.
Figure 11B:
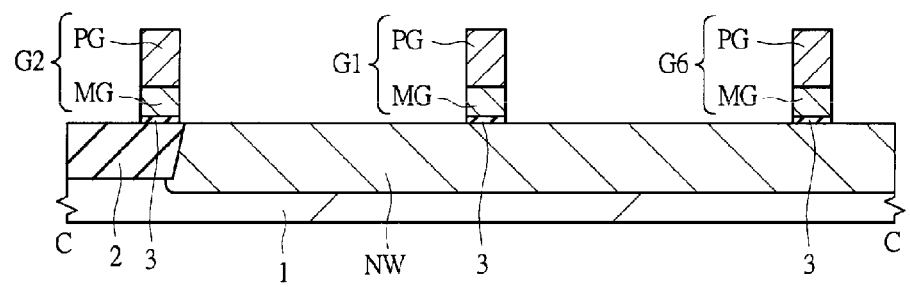
FIG. 11B is a cross-sectional view during a manufacturing process of the semiconductor device following FIG. 9B.

Next, as shown in FIG. 10, FIG. 11A, and FIG. 11B, by patterning the metal layer MGa, the polysilicon layer PGa, and the gate insulating film 3 using a photolithography method and a dry etching method, the gate electrodes G1 to G6 including the metal layer MGa and the polysilicon layer PGa are formed. The patterning is performed to form the side wall along the first direction of each gate electrode. With the side wall along the first direction of each gate electrode formed in this step, and the side wall of each gate electrode which is formed in advance by the patterning step described using FIG. 8, FIG. 9A, and FIG. 9B, a plurality of rectangular gate electrodes extending in the first direction are formed to be aligned in the first direction. Moreover, a plurality of structures including a plurality of gate electrodes, which are intermittently formed in the first direction, are formed to be aligned in the second direction perpendicular to the first direction. FIG. 10 shows the gate electrodes G1-G6 formed in this step, the element isolation region 2 formed on the upper surface of the semiconductor substrate and exposed from the gate electrodes G1 to G6, the p-well PW, and the n-well NW.

At this time, in FIG. 11A which shows the abutting portion of the gate electrodes G2 and G5 and is the cross-sectional view along the first direction, the metal layer MGa, the polysilicon layer PGa, and the gate insulating film 3 are not processed, while in FIG. 11B which is the cross-sectional view along the second direction, the gate electrodes G2, G1, and G6 formed to be aligned in the second direction are shown.

Although patterning gate electrodes at one-time can be considered, as described above, in the embodiment, two-time patterning including the patterning step described using FIG. 8, FIG. 9A and FIG. 9B and the patterning step described by using FIG. 10, FIG. 11A, and FIG. 11B is used. The patterning step described using FIG. 8, FIG. 9A, and FIG. 9B is the step referred to as the "end-cut" for forming the abutting portion of the gate electrodes extending in the first direction, the gate electrodes being formed to be aligned in the first direction. The removal of the metal layer MGa, the polysilicon layer PGa, and the gate insulating film 3 in the abutting portion can be performed more precisely in the case where the "end-cut" step is provided to form the abutting portion of the respective gate electrodes as compared with the case where the formation of gate electrodes is collectively performed by one-time patterning. The patterning step in forming the gate electrode is divided into multiple times of patterning and the "end-cut" is performed and then the gate electrode having a shorter interval in the abutting portion can be formed. Thus, the semiconductor device can be easily miniaturized.

In the embodiment, in the step of patterning the gate electrodes, including the "end-cut" step, the gate electrodes G1-G6 are formed by performing the "end-cut", first, followed by patterning. However, not limited to this, the gate electrodes G1 to G6 may be formed by forming the side face along the first direction of the gate electrode, first, followed by performing the "end-cut". In this case, a long pattern extending in the first direction is formed, first, and subsequently this pattern is separated into a plurality of patterns, and then the gate electrodes G1 to G6 are formed. At this time, the interval between the adjacent gate electrodes in the first direction (the space in the abutting portions) is about 40 nm.

Figure 12A:
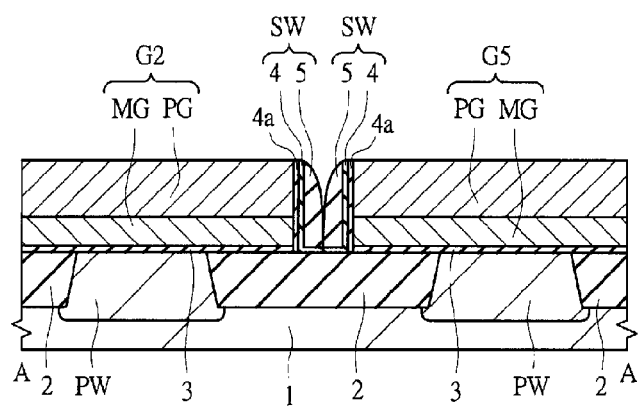
FIG. 12A is a cross-sectional view during a manufacturing process of the semiconductor device following FIG. 11A.
Figure 12B:
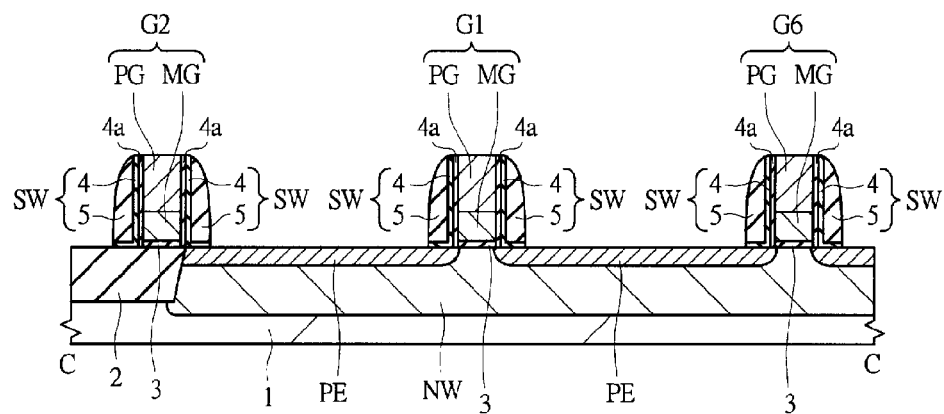
FIG. 12B is a cross-sectional view during a manufacturing process of the semiconductor device following FIG. 11B.

Next, as shown in FIG. 12A and FIG. 12B, by ion-implanting an n-type impurity, such as phosphorus (P) or arsenic (As), into the p-well PW on both sides of the gate electrode over the p-well PW, (a pair of) n⁻-type semiconductor regions (not illustrated) are formed. Moreover, by ion-implanting p-type impurities, such as boron (B), into the n-well NW on both sides of the gate electrode over the n-well NW, (a pair of) p⁻-type semiconductor regions PE are formed. In forming the n⁻-type semiconductor region, to prevent an n-type impurity from being introduced into the region where the p⁻-type semiconductor region PE is formed, a photoresist film is formed over the region where the p⁻-type semiconductor region PE is formed. On the contrary, in forming the p⁻-type semiconductor region, to prevent a p-type impurity from being introduced into the region where the n⁻-type semiconductor region is formed, a photoresist film is formed over the region where the n⁻-type semiconductor region is formed. Accordingly, although the formation of the n⁻-type semiconductor region and the formation of the p⁻-type semiconductor region PE are performed in separate steps, whichever step of forming the n⁻-type semiconductor region or step of forming the p⁻-type semiconductor region PE may come first. Because the p-well PW shown in FIG. 12A is a channel region directly under the gate electrodes G2 and G5, in this step the n-type impurity is not introduced and thus the n⁻-type semiconductor region is not formed.

Next, on the side wall of the gate electrodes G1, G2, G5, and G6, the offset spacer 4a including a silicon oxide film is formed, and subsequently as an insulating film, the sidewall (side wall insulating film) SW including a stacked film including the sequentially stacked silicon oxide film 4 and silicon nitride film 5 is formed. The offset spacer 4a is formed by partially removing the silicon oxide film, which is formed over the semiconductor substrate 1 by CVD or the like, by dry etching to leave the silicon oxide film on the side wall of each gate electrode in a self-aligning manner. The sidewall SW can be formed by sequentially depositing the silicon oxide film 4 and the silicon nitride film 5 over the semiconductor substrate 1 by CVD or the like from the semiconductor substrate 1 and subsequently carrying out anisotropic etching of the stacked film of the silicon oxide film 4 and silicon nitride film 5 by Reactive Ion Etching (RIE) or the like.

Then, as shown in FIG. 12A, in the abutting portion of the gate electrodes G2 and G5, the sidewall SW is formed so that the sidewalls SW on the side walls of the gate electrodes are approximately in contact with each other and so that the space between the gate electrodes G2 and G5 is embedded as much as possible. In the abutting portion, preferably, the upper surface of the semiconductor substrate 1 is completely covered with the sidewall SW, and even when the upper surface of the semiconductor substrate 1 is exposed, the area of the exposed semiconductor substrate 1 is preferably small as much as possible. The reason why the sidewalls SW facing each other in the abutting portion are brought close to each other is that the liner insulating film to be formed on the surface of the sidewall SW in a subsequent step is caused to close the space between the sidewalls SW. For this reason, the distance between the sidewalls SW facing each other in the place where the sidewalls SW facing each other are closest to each other is set to be equal to or less than twice the thickness of the liner insulating film to be subsequently formed in this place. It can be considered that by the etching step for forming the sidewall SW, a part of the exposed upper surface of the semiconductor substrate 1 is removed and thus the upper surface is formed into a shape such as a dent (see FIG. 25), and thus the height of the exposed upper surface of the semiconductor substrate 1 becomes lower than the upper surface of the semiconductor substrate 1 covered with the gate electrodes G1, G2, G5 and G6, the offset spacers 4a, and the sidewall SW. FIG. 12B to FIG. 17B do not show the shape of the major surface of the semiconductor substrate 1, which is dented by a part thereof removed.

Figure 13A:
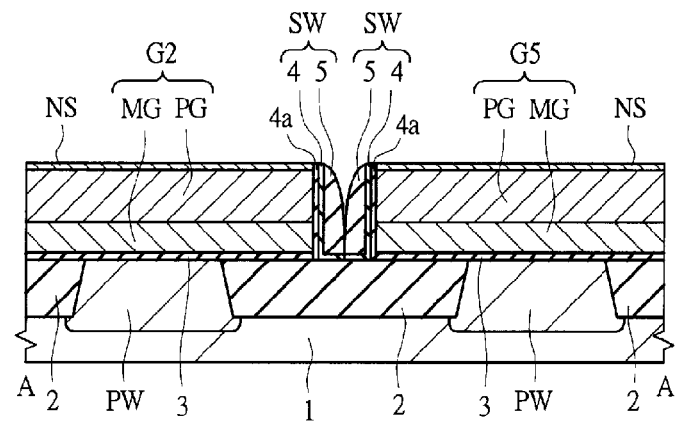
FIG. 13A is a cross-sectional view during a manufacturing process of the semiconductor device following FIG. 12A.
Figure 13B:
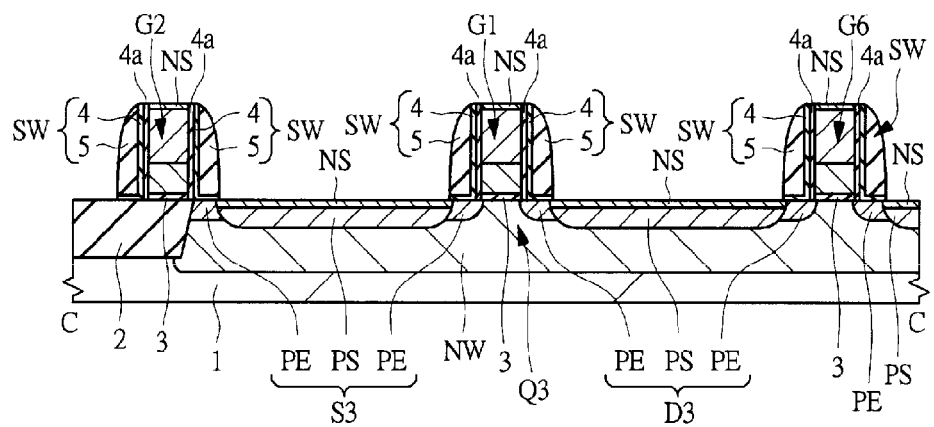
FIG. 13B is a cross-sectional view during a manufacturing process of the semiconductor device following FIG. 12B.

Next, as shown in FIG. 13A and FIG. 13B, a diffusion layer (not illustrated) which is an n⁺-type semiconductor region is formed by ion-implanting an n-type impurity, such as phosphorus (P) or arsenic (As), into the p-well PW (not illustrated) on both sides of the gate electrode and the sidewall SW. Moreover, a diffusion layer PS which is a p⁺-type semiconductor region is formed by ion-implanting a p-type impurity, such as boron (B), into the n-well NW on both sides of the gate electrodes G1, G2, and G6 and the sidewall SW of the side walls of these gate electrodes. The n⁺-type diffusion layer may be formed first or the p⁺-type diffusion layer PS may be formed first. After ion implantation, an annealing treatment for activation of the introduced impurity may be performed by heat treatment (spike annealing treatment) for approximately five seconds at approximately 1050° C. The depth (junction depth) of the n⁺-type diffusion layer is formed to be deeper than the depth (junction depth) of the n⁻-type semiconductor region, and the depth (junction depth) of the p⁺-type diffusion layer PS is formed to be deeper than the depth (junction depth) of the p⁻-type semiconductor region PE.

The impurity concentration of the n⁺-type diffusion layer is set to be higher than that of the n⁻-type semiconductor region, and the impurity concentration of the p⁺-type diffusion layer PS is set to be higher than that of the p⁻-type semiconductor region PE. Thus, an n-type semiconductor region (impurity diffusion layer) serving as the source or drain of the n-channel MISFET is formed by the n⁺-type diffusion layer and the n⁻-type semiconductor region, and a p-type semiconductor region (impurity diffusion layer) serving as the source or drain of the p-channel MISFET is formed by the p⁺-type diffusion layer PS and the p⁻-type semiconductor region PE. The source/drain regions of the n-channel MISFET and the p-channel MISFET have an lightly doped drain (LDD) structure. The n⁻-type semiconductor region and the p⁻-type semiconductor region PE are formed in a self-aligning manner with respect to the gate electrodes G1, G2, and G6, and the n⁺-type diffusion layer and the p⁺-type diffusion layer PS are formed in a self-aligning manner with respect to the sidewalls SW formed on the side walls of the gate electrodes G1, G2, and G6.

Because the p-well PW shown in FIG. 13A is the channel region directly under the gate electrodes G2 and G5, in this step the n-type impurity is not introduced and thus the n⁺-type diffusion layer is not formed. Moreover, as shown in FIG. 13B, the diffusion layer PS and the p⁻-type semiconductor region PE formed in a region between the gate electrodes G1 and G2 constitute the source region S3, while the diffusion layer PS and the p⁻-type semiconductor region PE formed in a region between the gate electrodes G1 and G6 constitute the drain region D3.

In this manner, over the p-well PW, the n-channel MISFET Q2 (see FIG. 1) is formed as a field effect transistor. Moreover, over the n-well NW, the P channel MISFET Q3, which is a field effect transistor including the gate electrode G1, and the source region S3 and the drain region D3 on both sides of the gate electrode G1, is formed.

Subsequently, using a self aligned silicide (salicide) technique, a silicide layer NS of a low resistance is formed on the upper surfaces of the gate electrodes G1, G2, G5, and G6, the n+-type diffusion layer (not illustrated), and the diffusion layer PS. As the method of forming the silicide layer NS, a metal film is formed (deposited) first over the major surface (the whole surface) of the semiconductor substrate 1 including each gate electrode using a sputtering method. The metal film includes a Ni (nickel)-Pt (platinum) alloy film (an alloy film of Ni and Pt).

After forming the metal film in this manner, the semiconductor substrate 1 is subjected to heat treatment using an rapid thermal anneal (RTA) method in an atmosphere of inert gas or nitrogen gas to cause a silicon film in contact with the metal film to selectively react with the metal film and then to form the silicide layer NS which is a metal-semiconductor reaction layer. Next, by performing a wet cleaning treatment, the unreacted metal film is removed, and subsequently by performing the second heat treatment, the silicide layer NS is annealed.

Figure 14A:
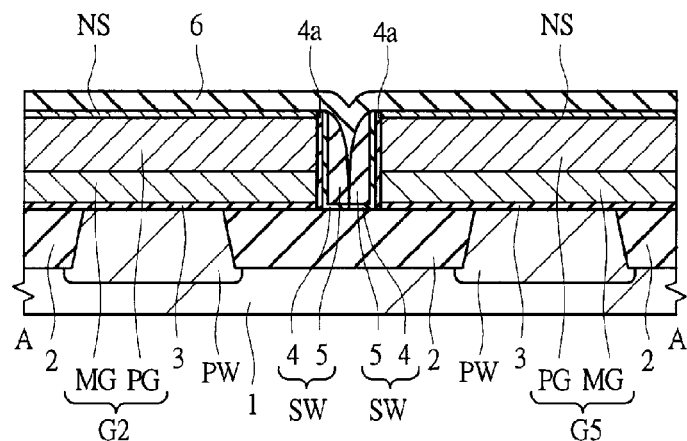
FIG. 14A is a cross-sectional view during a manufacturing process of the semiconductor device following FIG. 13A.
Figure 14B:
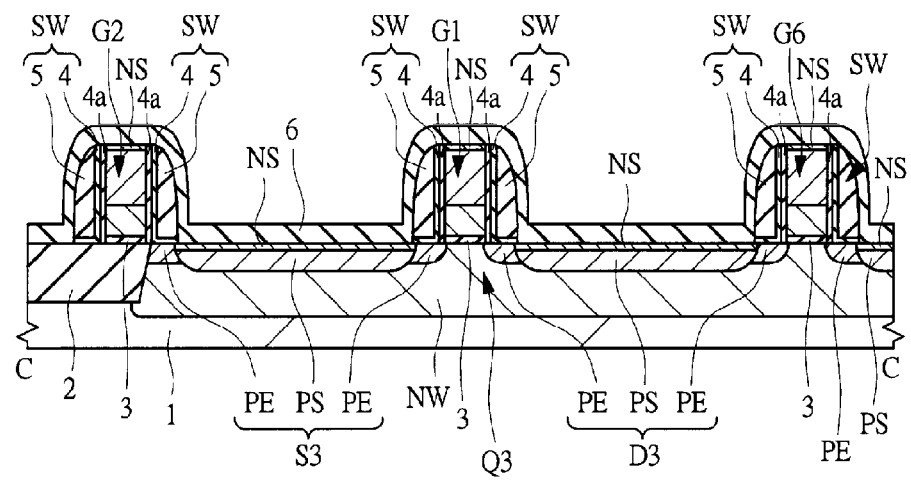
FIG. 14B is a cross-sectional view during a manufacturing process of the semiconductor device following FIG. 13B.

Next, as shown in FIG. 14A and FIG. 14B, the liner insulating film 6 is formed over the major surface of the semiconductor substrate 1. The liner insulating film 6 including a silicon nitride film is formed over the semiconductor substrate 1 including the silicide layer NS to cover the gate electrodes G1, G2, G5, and G6. The liner insulating film 6 can be formed by a plasma CVD method at the deposition temperature (substrate temperature) of about 450° C.

Then, as shown in FIG. 14B, the distance between the gate electrodes G1 and G2 or between the gate electrodes G1 and G6 in the second direction is longer than that between the gate electrodes G2 and G5 in the first direction shown in FIG. 14A, and is longer than twice the thickness of the liner insulating film 6 formed on the side wall of the sidewall SW. For this reason, the liner insulating film 6 on the side surfaces of the sidewalls SW facing each other between the adjacent gate electrodes in the second direction is not in contact with each other and the space between the sidewalls SW is not be closed by the liner insulating film 6. Moreover, the liner insulating film 6 directly above the upper surface of the semiconductor substrate 1 exposed from the sidewall SW between the adjacent gate electrodes in the second direction is formed in a region wider than the abutting portion to be along the major surface of the semiconductor substrate 1.

In contrast, in the abutting portion of the gate electrodes G2 and G5 shown in FIG. 14A, the semiconductor substrate 1 is hardly exposed and the distance between sidewalls SW is equal to or less than twice the thickness of the liner insulating film 6 formed on the side wall of the sidewall SW, and thus the liner insulating films 6 of these side walls are in contact with each other between the sidewalls SW. In the abutting portion, the liner insulating film 6 is not formed along the upper surface of the semiconductor substrate 1 in a wide region in the upper surface of the flat semiconductor substrate 1, but is formed to be embedded into a narrow region between the sidewalls SW adjacent facing each other. Accordingly, the height of the upper surface of the liner insulating film 6 formed between the sidewalls SW of the abutting portion, even at the lowest position, is higher than the height of the upper surface of the liner insulating film 6 formed between the gate electrodes G1 and G2 in the second direction shown in FIG. 14B or along the semiconductor substrate 1 between the gate electrodes G1 and G6.

As described using FIG. 24 and FIG. 25 showing the semiconductor device which is the comparative example, in the abutting portion of the gate electrodes, when the distance between the sidewalls SW facing each other is longer than twice the thickness of the liner insulating film 6a formed on the side wall of the sidewall SW, the liner insulating film 6a formed over the major surface of the semiconductor substrate 1 does not close the space. For this reason, the lowest position of the upper surface of the liner insulating film 6a of the abutting portion is about as high as the lowest position of the upper surface of the liner insulating film 6a between the adjacent gate electrodes in the second direction. Alternatively, because of a reduction in the coverage of the liner insulating film 6a in the abutting portion, the lowest position of the upper surface of the liner insulating film 6a of the abutting portion is lower than the lowest position of the upper surface of the liner insulating film 6a between the adjacent gate electrodes in the second direction. In this case, in the abutting portion, the liner insulating film 6a is formed along the major surface of the semiconductor substrate 1, and is formed, with a volume larger than the liner insulating film 6a of the embodiment, in a narrow region in the lower portion of the deep groove between the gate electrodes.

In the lower portion of the deep narrow groove as shown in FIG. 25, the liner insulating film 6a is most likely to form a void inside the liner insulating film. 6a. When avoid is formed between a plurality of contact plugs formed over the semiconductor substrate 1, if a metal member constituting the contact plug is formed inside the void, then the contact plugs may be electrically connected to each other via the metal member inside the void and the semiconductor element may not normally operate. For this reason, in a narrow groove such as the abutting portion of the gate electrodes, to prevent a void from being formed inside the liner insulating film, the liner insulating film is preferably not formed under the groove as much as possible.

In contrast, in the embodiment, by reducing the interval between the sidewalls SW so that the liner insulating films 6 formed on the side walls of the sidewalls SW facing each other in the abutting portion of the gate electrodes are in contact with each other and close the space between the side walls, the space between the sidewalls SW under the abutting portion is reduced. For this reason, the lowest position of the upper surface of the liner insulating film 6 of the abutting portion is higher than the lowest position of the upper surface of the liner insulating film 6 formed over the major surface of the semiconductor substrate 1 between the adjacent gate electrodes in the second direction. As a result, the liner insulating film 6 can be hardly formed in the lower portion of the abutting portion, near the major surface of the semiconductor substrate 1.

Thus, in the embodiment, in the abutting portion where the edges of the gate electrodes extending in the first direction face to each other, a void can be prevented from being generated inside the insulating film over the semiconductor substrate. Accordingly, a short circuit between the contact plugs due to the generation of a void can be prevented. Therefore, the reliability of the semiconductor device can be improved and the yield of the semiconductor device can be improved.

Figure 15A:
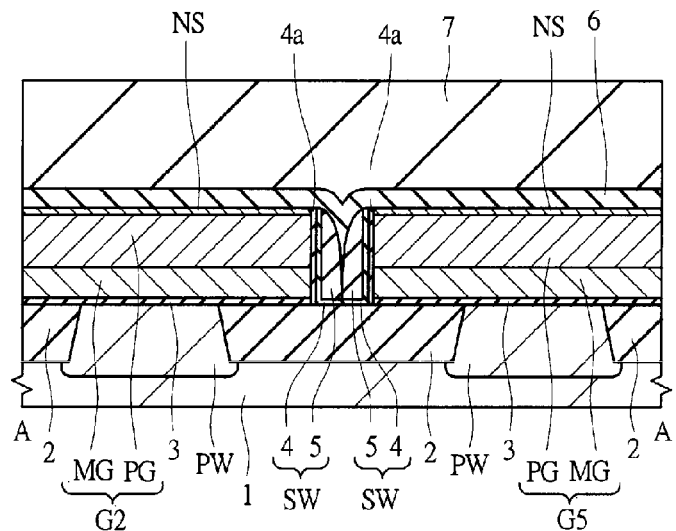
FIG. 15A is a cross-sectional view during a manufacturing process of the semiconductor device following FIG. 14A.
Figure 15B:
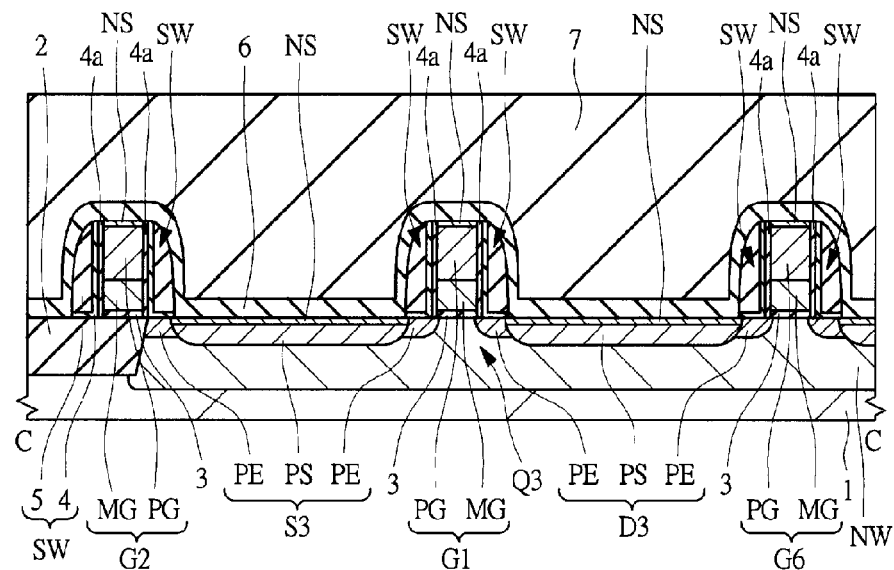
FIG. 15B is a cross-sectional view during a manufacturing process of the semiconductor device following FIG. 14B.

Next, as shown in FIG. 15A and FIG. 15B, the interlayer insulating film 7 thicker than the liner insulating film 6 is formed over the liner insulating film 6. The interlayer insulating film 7 includes a silicon oxide film, and can be formed by a plasma CVD method at the deposition temperature of approximately 450° C. through the use of TEOS. Subsequently, the upper surface of the interlayer insulating film 7 is planarized by polishing the surface of the interlayer insulating film 7 by a CMP method. Even if an irregular shape is formed in the surface of the liner insulating film 6 due to a step in the underlayers, an interlayer film whose surface is planarized can be obtained by polishing the surface of the interlayer insulating film 7 by a CMP method.

Figure 16A:
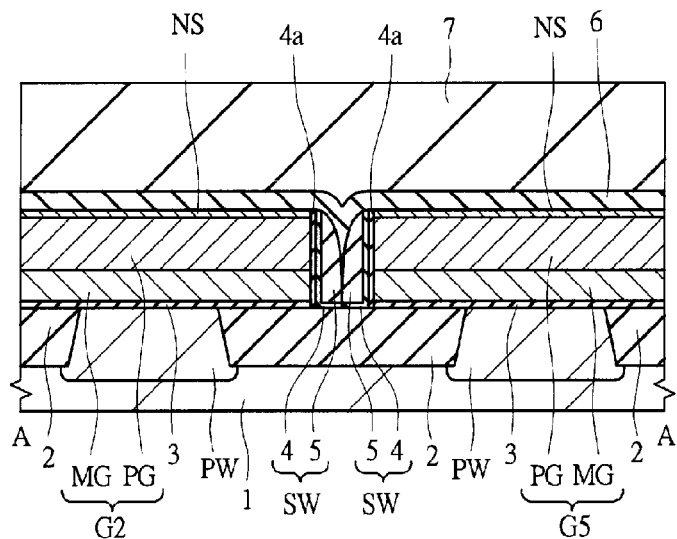
FIG. 16A is a cross-sectional view during a manufacturing process of the semiconductor device following FIG. 15A.
Figure 16B:
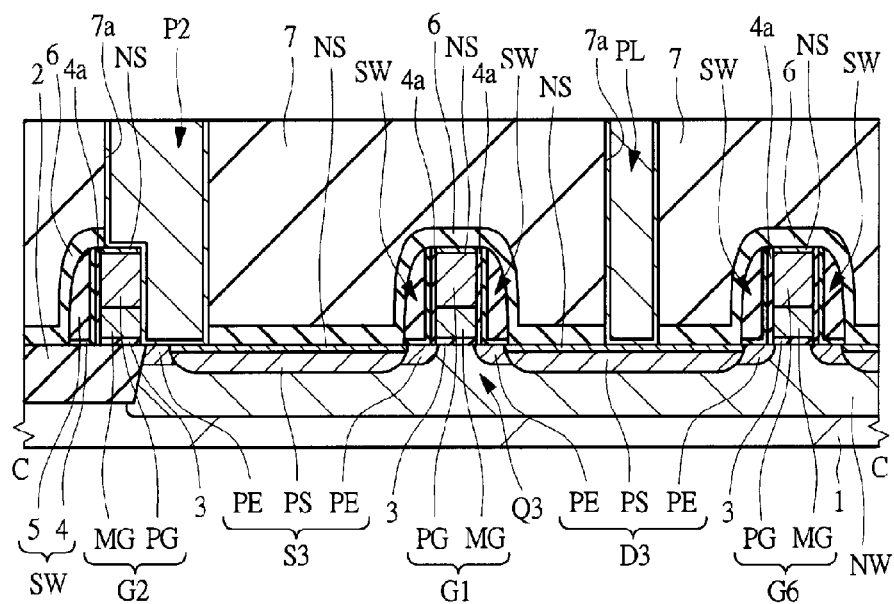
FIG. 16B is a cross-sectional view during a manufacturing process of the semiconductor device following FIG. 15B.

Next, as shown in FIG. 16A and FIG. 16B, using a photoresist pattern (not illustrated) formed over the interlayer insulating film 7 as an etching mask, the interlayer insulating film 7 and the liner insulating film 6 are dry-etched to form a contact hole (a through-hole, a hole) 7a in the liner insulating film 6 and the interlayer insulating film 7. In this case, first, the interlayer insulating film 7 is dry-etched, under conditions that the interlayer insulating film 7 is easily etched as compared with the liner insulating film 6, to cause the liner insulating film 6 to function as an etching stopper film, and then to form the contact hole 7a in the interlayer insulating film 7. Subsequently, under the conditions that the liner insulating film 6 is easily etched as compared with the interlayer insulating film 7, the liner insulating film 6 at the bottom part of the contact hole 7a is dry-etched and removed. At the bottom part of the contact hole 7a, a part of the major surface of the semiconductor substrate 1 (a part of the silicide layer NS over the $n^+$-type diffusion layer), the diffusion layer PS, and the gate electrodes G1, G2, G5, and G6 is exposed. At this time, the sidewall SW and the offset spacer 4a of the side wall of the gate electrode G2, the side wall being near the gate electrode G1, are removed, and inside one contact hole 7a, the gate electrode G2 and the source region S3 are exposed.

Next, the contact plugs (a conductor portion for connection, an embedded plug, an embedded-conductor portion) PL and P2 each including tungsten (W) and the like are formed inside the contact hole 7a. The contact plug PL is formed inside the contact hole 7a where the drain region D3 is exposed, and the contact plug P2 is formed inside the contact hole 7a where the gate electrode G2 and the source region S3 are exposed. To form the contact plugs PL and P2, a barrier conductive film (a titanium film, a titanium nitride film, or a stacked film composing these films) is formed over the interlayer insulating film 7, including the inside (the bottom part and the side wall) of the contact hole 7a, by a plasma CVD method at the deposition temperature (substrate temperature) of about 450° C. Then, a major conductor film including a tungsten film and the like is formed over the barrier conductive film by CVD or the like to fill the contact hole 7a, and the unnecessary major conductor film and barrier conductive film over the interlayer insulating film 7 are removed by CMP or etch-back, thereby forming the contact plugs PL and P2 including the major conductor film and the barrier conductive film. The contact plug PL formed over each of the $n^+$-type diffusion layer, the diffusion layer PS, and the gate electrodes G1, G5, and G6 is, at the bottom part of the contact plug PL, in contact with and electrically connected to the silicide layer NS over the surfaces of the $n^+$-type diffusion layer, the diffusion layer PS, and the gate electrodes G1, G5, and G6.

When a void is formed inside the liner insulating film 6 of the abutting portion shown in FIG. 16A, a part of the metal member constituting the contact plug is formed inside the void which is connected to the contact hole 7a and exposed, and thus the contact plug and other contact plugs may be short-circuited via the metal member inside the void. However, in the semiconductor device of the embodiment, as described above, because the void is prevented from being generated inside the liner insulating film 6, a short circuit between the contact plugs can be prevented.

Although not shown in FIG. 16A, the contact plug is arranged near the abutting portion on both sides in the second direction of the gate electrodes G2 and G5 and the abutting portion of these electrodes to sandwich the gate electrodes G2 and G5 or the abutting portion of these electrodes. Moreover, the contact plug is also formed over the gate electrode in the region, which is not shown in FIG. 16A and FIG. 16B, and also over the source/drain region. The gate electrodes G1 and G5, and G6 are also electrically connected to the contact plugs formed over these electrodes, in other region which is not illustrated.

Figure 17A:
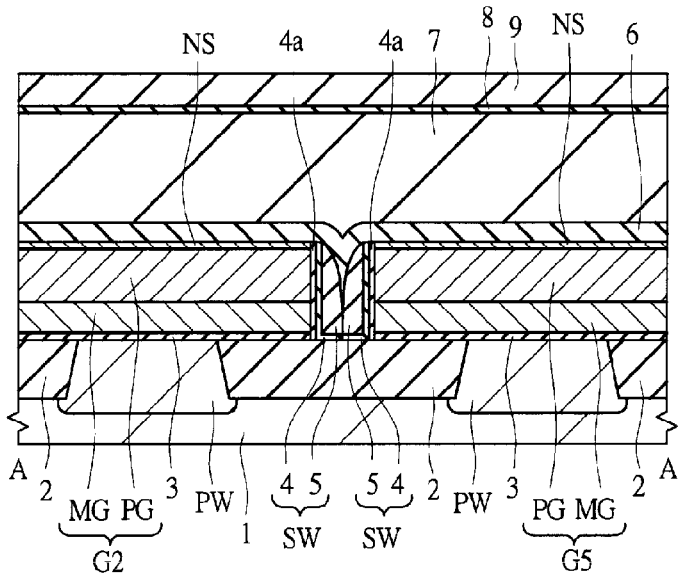
FIG. 17A is a cross-sectional view during a manufacturing process of the semiconductor device following FIG. 16A.
Figure 17B:
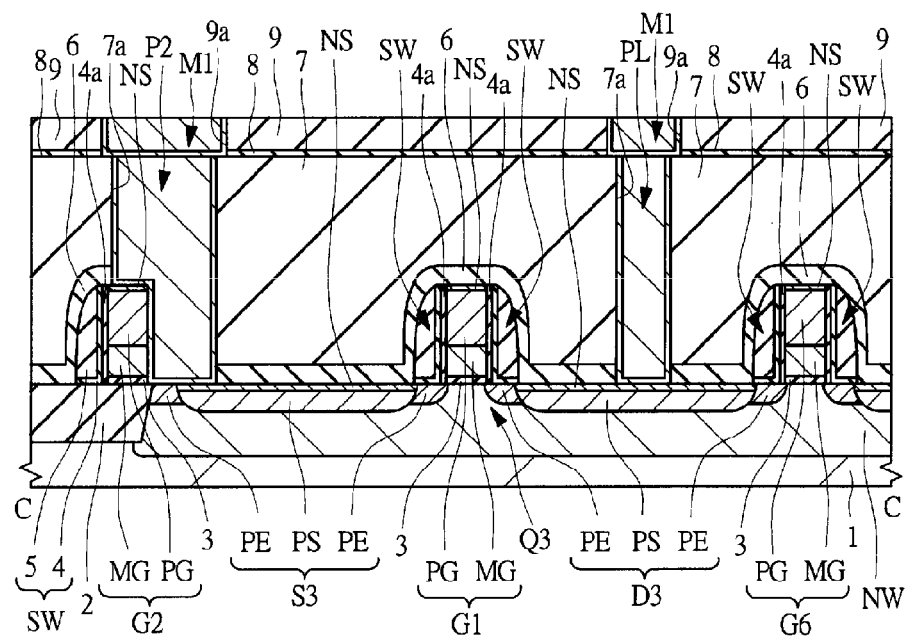
FIG. 17B is a cross-sectional view during a manufacturing process of the semiconductor device following FIG. 16B.

Next, as shown in FIG. 17A and FIG. 17B, over the interlayer insulating film 7, into which the contact plugs PL and P2 are embedded, the stopper insulating film 8 and the interlayer insulating film 9 for forming wirings are sequentially formed. The stopper insulating film 8 is a film serving as an etching stopper in grooving the interlayer insulating film 9. A material having an etching selectivity with respect to the interlayer insulating film 9 is used for the stopper insulating film 8. The stopper insulating film 8 can be a silicon nitride film formed by a plasma CVD method, and the interlayer insulating film 9 can be a silicon oxide film formed by a plasma CVD method. The first-layer wiring to be described next is formed in the stopper insulating film 8 and the interlayer insulating film 9.

Next, the first-layer wiring is formed by a single damascene method. First, the wiring groove 9a is formed in a predetermined region of the interlayer insulating film 9 and the stopper insulating film 8 by dry etching with a resist pattern (not illustrated) as a mask, and subsequently a barrier conductive film (barrier metallic film) is formed over the major surface of the semiconductor substrate 1 (over the interlayer insulating film 9, including the bottom part and inner wall of the wiring groove 9a). For the barrier conductive film, a titanium nitride film, a tantalum layer, or a tantalum nitride film can be used. Next, a copper seed layer is formed over the barrier conductive film by a CVD method, a sputtering method or the like, and furthermore a copper plating film is formed over the seed layer using an electrolysis plating method or the like. The inside of the wiring groove 9a is embedded with the copper plating film. Then, the copper plating film, the seed layer, and the barrier conductive films in regions other than the region of the wiring groove 9a are removed by a CMP method to form the first-layer metal wiring M1 including copper as the principal component and including the copper plating film, the seed layer, and the barrier conductive film. A plurality of metal wirings M1 are electrically connected to the $n^+$-type diffusion layer, the diffusion layer PS, and the gate electrodes G1, G2, G5, and G6 via the contact plug PL or P2. Subsequently, the second-layer wiring is formed over the metal wiring M1 by a dual damascene method. The illustration and the description will be omitted. Accordingly, the semiconductor device of the embodiment is completed.

In the embodiment, as described above, the interval between the sidewalls SW facing each other of the abutting portion of the gate electrodes is shortened to prevent the liner insulating film from being formed in a lower portion of the abutting portion, as in the case of the comparative example shown in FIG. 25, thereby making it possible to prevent avoid from being formed inside the liner insulating film and prevent a plurality of contact plugs from being short-circuited via the void.

Then, from a view point of more effectively preventing a void from being formed inside the liner insulating film 6, the lowest position of the upper surface of the liner insulating film 6 in the abutting portion is preferably higher than the upper surface of the gate electrodes G2 and G5.

An SRAM with a gate electrode formed using the "end-cut" has been described in the embodiment, but in the step of patterning gate electrodes, the gate electrodes may be collectively formed by an etching without using the "end-cut". This is because the problem to be solved by the present invention can, if the interval in abutting portion between gate electrodes is short, happen even if the gate electrodes are formed by a method not using the "end-cut".

Moreover, the present invention can be applied to other semiconductor devices, not limited to the semiconductor device with an SRAM. Specifically, the present invention can be applied to a semiconductor device including a plurality of gate electrodes and a plurality of contact plugs, the plurality of contact plugs generating an electric potential difference in operation, in which two gate electrodes extending in a first direction are adjacent to each other in the first direction, and in which the gate electrodes are arranged, near an abutting portion of the gate electrodes to sandwich the edge or the abutting portion of the gate electrodes facing each other by sandwiching the abutting portion.

Moreover, although a structure, in which the offset spacer is formed on a side wall of each gate electrode, has been described in the embodiment, the offset spacer may not be formed.

Hereinafter, a semiconductor device of a first variant, which is a modification of the semiconductor device of the embodiment, and semiconductor devices, which are a second modification and a third modification, will be described.

Figure 18A:
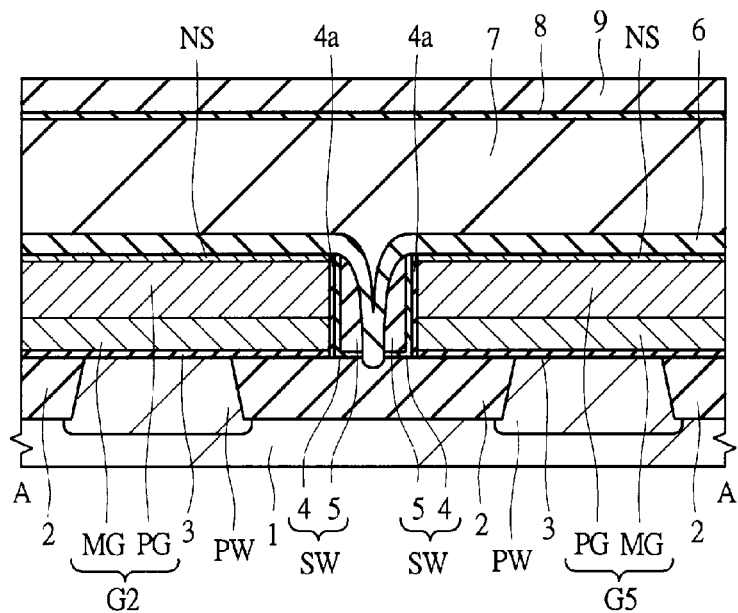
FIG. 18A is a cross-sectional view showing a first modification of Embodiment 1.
Figure 18B:
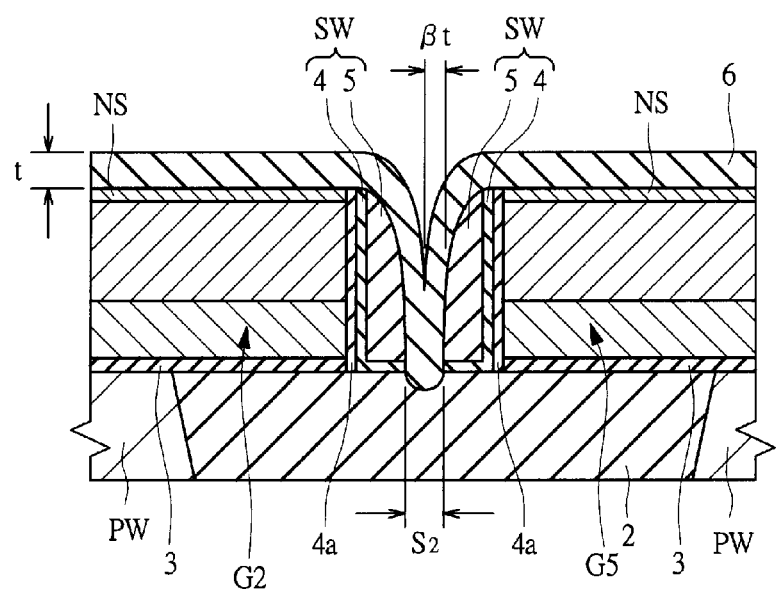
FIG. 18B is a cross-sectional view showing the first modification of Embodiment 1.

The semiconductor device of the first modification, as shown in FIG. 18A and FIG. 18B, has a longer interval between the sidewalls SW facing each other formed in the abutting portion of the gate electrodes G2 and G5 than the semiconductor device shown in FIG. 2. The first modification is a semiconductor device having about the same structure as the semiconductor device shown in FIGS. 1 to 4. FIG. 18A is a cross-sectional view at the same position as the A-A line of FIG. 1. FIG. 18B is a cross-sectional view of the semiconductor device of the first modification of the embodiment for explaining Formula (2) below. Although FIG. 18B is an enlarged view of a part of FIG. 18A, FIG. 18B shows no structure formed above the liner insulating film 6.

As shown in FIG. 18A and FIG. 18B, the interval between the sidewalls SW facing each other of the abutting portion of the gate electrodes is longer than the interval between the sidewall SW shown in FIG. 2. Also in the semiconductor device of FIG. 18A and FIG. 18B, the fact that the sidewalls SW facing each other are arranged with a space equal to or less than twice the thickness of the liner insulating film 6 formed on the side wall of the sidewall SW is the same as in the structure shown in FIG. 2. For this reason, the liner insulating film 6 closes the space between the sidewalls SW in a lower portion of the abutting portion, and the lowest position of the upper surface of the liner insulating film 6 between the gate electrodes (abutting portion) in the first direction is higher than the lowest position of the upper surface of the liner insulating film 6 between the adjacent gate electrodes in the second direction. Accordingly, the same effect as the above-mentioned effect can be obtained. That is, by preventing a void from being generated inside the liner insulating film 6 of the abutting portion, a short circuit failure between different contact plugs can be prevented.

The structure of the above-mentioned semiconductor device shown in FIG. 18B is expressed by Formula (2) below.

$$S_2 \leq 2 \times \beta t \quad (2)$$

Where $S_2$ is the distance between the sidewalls SW adjacent to each other in the first direction in the abutting portion. "β" is the coverage (%) of the liner insulating film 6 at an edge of the sidewall SW of the first direction, the edge is not in contact with the gate electrode or the offset spacers 4a, and "t" is the thickness setting of the liner insulating film 6. "βt" is the thickness of the liner insulating film 6 formed at the edge of the sidewall SW. Formula (2) indicates that the distance $S_2$ between the sidewalls SW is equal to or less than twice the thickness of the liner insulating film 6 formed at the edge of the sidewall SW. Accordingly, Formula (2) specifies that in the semiconductor device shown in FIG. 18B, the liner insulating films 6 formed at the opposing edges of the sidewalls SW facing each other are in contact with each other and close the space inside the abutting portion.

Figure 19:
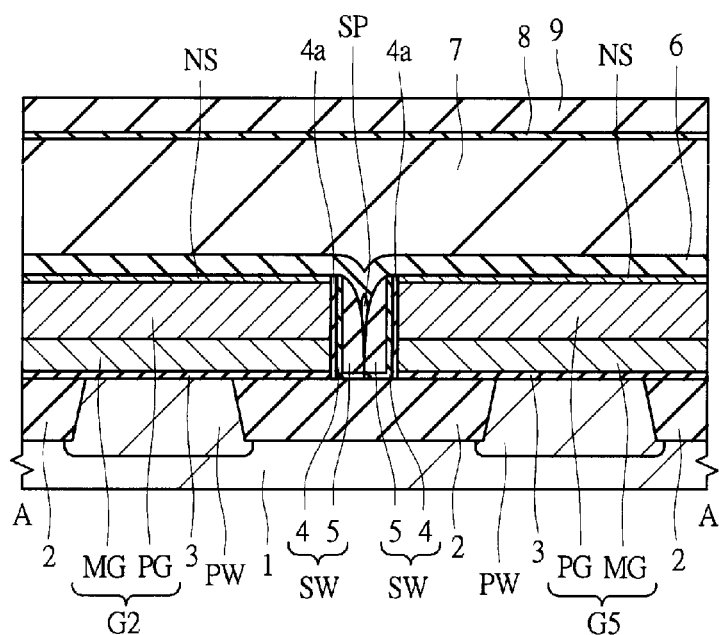
FIG. 19 is a cross-sectional view showing a second variant of Embodiment 1.

Although the semiconductor device of the second modification has about the same structure as the semiconductor device shown in FIGS. 1 to 4, it differs from the semiconductor device shown in FIG. 2 in that a void SP is intentionally formed inside the liner insulating film 6 of the abutting portion of the gate electrodes G2 and G5, as shown in FIG. 19. FIG. 19 is a cross-sectional view in the same position as the A-A line in FIG. 1.

In a semiconductor device with an MISFET, a parasitic capacitance due to capacitive coupling between electrodes is present as a factor of reducing the circuit speed (operation speed) of the semiconductor device, and thus the recent semiconductor devices in which electrode patterns are densely arranged due to further integration for improving the operation speed needs to reduce the parasitic capacitance.

In contrast to this, in the semiconductor device shown in FIG. 19 which is the second modification of the embodiment, a space, in which the insulating film and the like are not formed, is provided by intentionally forming the void SP covered with the liner insulating film 6 between the sidewalls SW facing each other in the abutting portion of the gate electrodes. Because the void SP is a region having a dielectric constant lower than the sidewall SW, the liner insulating film 6, or the interlayer insulating film 7, the parasitic capacitance between the gate electrodes can be reduced by the void SP being formed between the gate electrodes.

The semiconductor device of the second modification shown in FIG. 19 also exhibits an effect of reducing the parasitic capacitance as described above in addition to the effect of the semiconductor device described by using FIG. 1 to FIG. 5B. Since the void SP, unlike the void causing a short-circuit between contact plugs described by using the comparative example, is closed with the liner insulating film 6 even in a state where the contact hole is formed, a metal member constituting the contact plug is not formed inside the void SP. The void SP is not formed in the region where the contact hole is formed.

Figure 20:
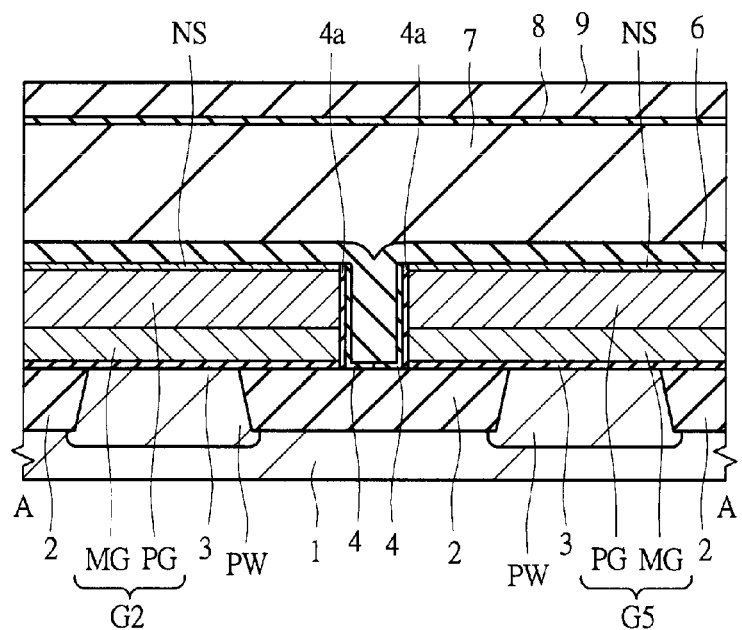
FIG. 20 is a cross-sectional view showing a third modification of Embodiment 1.

Moreover, although the semiconductor device of the third modification has almost the same structure as the semiconductor device shown in FIGS. 1 to 4, the silicon nitride film 5 constituting the sidewall SW in FIG. 2 is not formed between the gate electrodes G2 and G5 as shown in FIG. 20, but the silicon oxide film 4 with an L-shaped cross section is formed via the offset spacer 4a on the side walls of the gate electrodes G2 and G5. In the third modification, in the region where the silicon nitride film 5 is formed in FIG. 2, the liner insulating film 6 is formed as shown in FIG. 20. In the abutting portion, the silicon oxide film 4 is continuously formed along the upper surface of the semiconductor substrate 1 and along the side wall of the gate electrodes G2 and G5. The silicon oxide film 4 is between the liner insulating film 6 and the respective side walls of the gate electrodes G2 and G5. FIG. 20 is a cross-sectional view in the same position as the A-A line in FIG. 1.

As shown in FIG. 20, the silicon oxide films 4 in the abutting portion are arranged so that the edges of the bottom part formed in parallel to the major surface of the semiconductor substrate 1 are approximately in contact with each other. The liner insulating film 6 is embedded between the silicon oxide films 4 facing each other. The distance between the silicon oxide films 4 formed along the respective side walls of the gate electrodes G2 and G5 is equal to or less than twice the film thickness of the liner insulating film 6 formed on the side walls of the gate electrodes G2 and G5, and thus in the abutting portion, the groove between gate electrodes is closed by the liner insulating films 6 being in contact with each other.

In this case, because the liner insulating film 6 applying a stress to the gate electrode comes closer to the gate electrode G2 or G5 than in the semiconductor device shown in FIG. 2, the stress applied to the channel of the gate electrode G2 or G5 increases. Since the MISFET has a property in which the more the stress is applied in a direction of the channel, the more easily the current flows, the semiconductor device of the third modification in FIG. 20 exhibits an effect of improving the operation speed of the MISFET in addition to the effect of the semiconductor device described by using FIG. 1 to FIG. 5B.

To form the structure shown in FIG. 20, the sidewall SW may be formed by using the step of FIG. 12A and FIG. 12B and subsequently the silicon nitride film 5 may be removed by wet etching using phosphoric acid or the like, and then the steps from the steps described by using FIG. 13A and FIG. 13B to the steps described using FIG. 17A and FIG. 17B may be performed.

Figure 21:
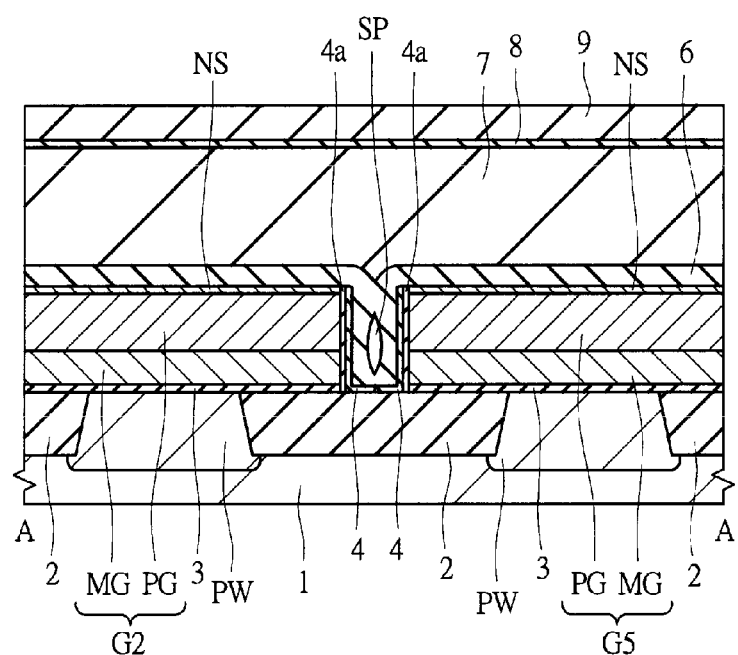
FIG. 21 is a cross-sectional view showing the third modification of Embodiment 1.

Moreover, in the semiconductor device of the third modification, the structure of the second variant can be applied. As shown in FIG. 21, in a semiconductor device having a structure almost the same structure as the semiconductor device in FIG. 20, the void SP may be intentionally provided inside the liner insulating film 6 closing the space in the abutting portion. Thus, in addition to the effect of preventing the short-circuit between contact plugs as described above and the effect of improving the operation speed of the MISFET by increasing the stress applied to a gate electrode, the effect of improving the operation speed of the semiconductor device by reducing the parasitic capacitance between gate electrodes can be obtained as with the second modification.

Embodiment 2

Figure 22:
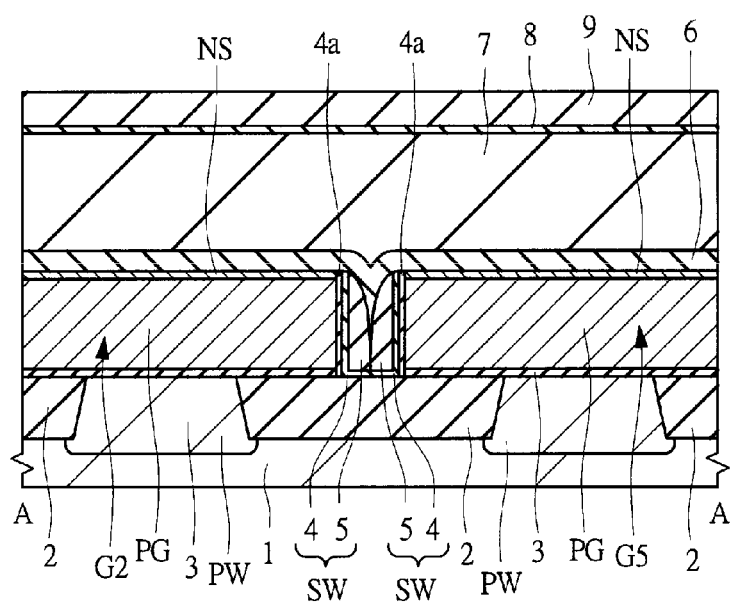
FIG. 22 is a cross-sectional view showing a semiconductor device of Embodiment 2 in accordance with the present invention.
Figure 23:
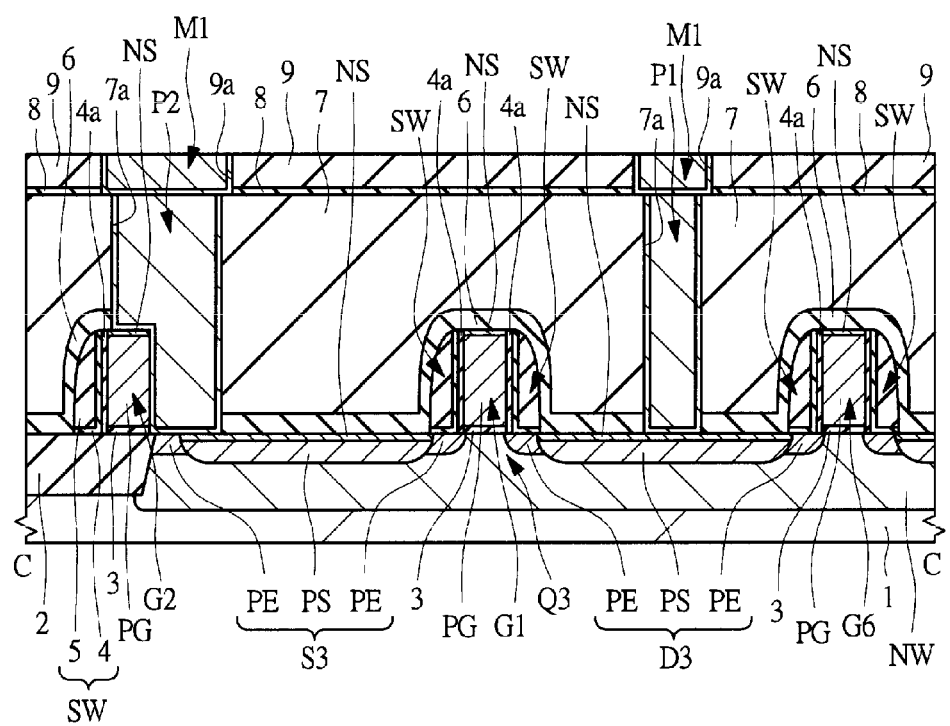
FIG. 23 is a cross-sectional view showing the semiconductor device of Embodiment 2 in accordance with the present invention.

In the above-described embodiment, an SRAM including the gate electrodes G1 to G6 including the metal gate layer MG, which is a metal film, and the polysilicon layer PG as shown in FIGS. 1 to 4 has been described. The semiconductor device of the embodiment has almost the same structure as that of the SRAM shown in FIGS. 1 to 4, but does not include the metal gate layer as shown in FIG. 22 and FIG. 23, and differs from the semiconductor device of Embodiment 1 described above in that it includes the gate electrodes G1, G2, G5, and G6 including only the polysilicon layer PG. FIG. 22 is a cross-sectional view of the semiconductor device in accordance with the embodiment in the same position as in FIG. 2. FIG. 23 is a cross-sectional view of the semiconductor device in accordance with the embodiment in the same position as in FIG. 4.

Even in the semiconductor device including the gate electrodes G1, G2, G5, and G6 including only the polysilicon layer PG, by closing a space in the abutting portion between the adjacent gate electrodes in the first direction with the liner insulating film 6, a void can be prevented from being formed inside the liner insulating film 6 and the same effect as that of Embodiment 1 described above can be obtained. As with Embodiment 1 described above, in semiconductor devices with an SRAM including a polysilicon gate, the above-mentioned first modification to third modification can be applied.

In Embodiments 1 and 2, when gate electrodes are formed by performing the "end-cut" through multiple times of patterning, the present invention is applied to the abutting portion having a short interval between the formed gate electrodes. However, even when the abutting portion is formed with an interval as short as approximately 30 to 50 nm by a patterning even if patterning is not performed multiple times, the above-mentioned effects can be obtained by applying the present invention.

The present invention of the present inventor has been described specifically according to the embodiments. However, the present invention is not limited to the embodiments, but various modifications are possible without departing from the gist of the invention.

The present invention is effectively applied to the techniques for manufacturing semiconductor devices including a semiconductor element with a gate electrode having a short interval in an abutting portion.

What is claimed is:
1. A semiconductor device comprising:
 a semiconductor substrate having a main surface;
 a first gate electrode and a second gate electrode extending in a first direction and arranged linearly in the first direction with a gap over the main surface of semiconductor substrate;
 a first insulating film formed on a first upper surface of the first gate electrode and a second upper surface of the second gate electrode and formed over the main surface of the semiconductor substrate between the first gate electrode and the second gate electrode;
 a second insulating film over the first insulating film; and
 a contact plug connected with the first gate electrode buried in a contact hole formed in the first insulating film and the second insulating film;
 wherein the first gate electrode has a first side surface and the second gate electrode has a second side surface,
 wherein the first side surface and the second side surface face each other in the first direction,
 wherein a third upper surface of the first insulating film formed between the first side surface and the second side surface is higher than the first upper surface of the first gate electrode,
 wherein a first sidewall is formed on the first side surface and a second sidewall is formed on the second side surface between the first gate electrode and the second gate electrode in the first direction,
 wherein the first sidewall contacts with the second sidewall in the first direction.
2. The semiconductor device according to claim 1,
 wherein a void covered with the first insulating film is formed between the first gate electrode and the second gate electrode in the first direction.
3. The semiconductor device according to claim 1,
 wherein the first insulating film is SiN, and
 wherein the second insulating film is SiO.
4. The semiconductor device according to claim 1,
 wherein the first insulating film is formed on the first sidewall and the second sidewall between the first side surface and the second side surface.

5. The semiconductor device according to claim 1, further comprising:
   a first active region and a second active region formed in the main surface of the semiconductor substrate,
   wherein the first gate electrode intersects the first active region and the second gate electrode intersects the second active region.

* * * * *